(12) United States Patent
Kitai et al.

(10) Patent No.: US 8,674,714 B2
(45) Date of Patent: Mar. 18, 2014

(54) SYSTEM AND METHOD FOR PROBING WORK PIECES

(75) Inventors: Anton Theodore Kitai, Ottawa (CA); Paul Andrew Labelle, Smith Falls (CA); Robert Glenn Parker, Ottawa (CA); David R. Walker, Kanata (CA)

(73) Assignee: PPI Systems, Inc., Ottawa (CA)

( * ) Notice: Subject to any disclaimer, the term of this patent is extended or adjusted under 35 U.S.C. 154(b) by 909 days.

(21) Appl. No.: 12/667,106

(22) PCT Filed: Jun. 27, 2008

(86) PCT No.: PCT/CA2008/001195
§ 371 (c)(1),
(2), (4) Date: Jul. 13, 2010

(87) PCT Pub. No.: WO2009/003277
PCT Pub. Date: Jan. 8, 2009

(65) Prior Publication Data
US 2010/0271058 A1    Oct. 28, 2010

Related U.S. Application Data

(60) Provisional application No. 60/947,246, filed on Jun. 29, 2007.

(51) Int. Cl.
*G01R 31/00* (2006.01)
(52) U.S. Cl.
USPC .................................................. 324/750.19
(58) Field of Classification Search
USPC ............... 324/750.01–750.3, 762.01–762.1, 324/754.01–754.3, 755.01–755.1; 257/48; 438/14–18
See application file for complete search history.

(56) References Cited

U.S. PATENT DOCUMENTS

| 3,185,927 | A | * | 5/1965 | Margulis et al. ......... 324/750.22 |
| 5,850,146 | A | | 12/1998 | Shim et al. |
| 6,307,389 | B1 | * | 10/2001 | Buks et al. .............. 324/750.22 |
| 6,876,211 | B2 | | 4/2005 | Chung et al. |
| 6,967,473 | B1 | | 11/2005 | Reed et al. |
| 7,024,783 | B2 | | 4/2006 | Trull et al. |

FOREIGN PATENT DOCUMENTS

WO    WO 00/02030    1/2000

OTHER PUBLICATIONS

International Search Report for patent application No. PCT/CA2008/001195, dated Jul. 2008, 3 pages.

* cited by examiner

*Primary Examiner* — Tung X Nguyen
(74) *Attorney, Agent, or Firm* — Shumaker & Sieffert, P.A.

(57) ABSTRACT

A system and method of probing work pieces is described. A first and second arm each having a pivot point and a guide end are pivotally coupled together at the respective pivot points. A probe tip holder is coupled to at least one of the first arm or the second arm. A guide means guides movement of the guide ends of the pivotally coupled arms, such that movement of the guide end of the first arm and the second arm move the probe tip holder in a plane parallel to the work piece surface.

21 Claims, 20 Drawing Sheets

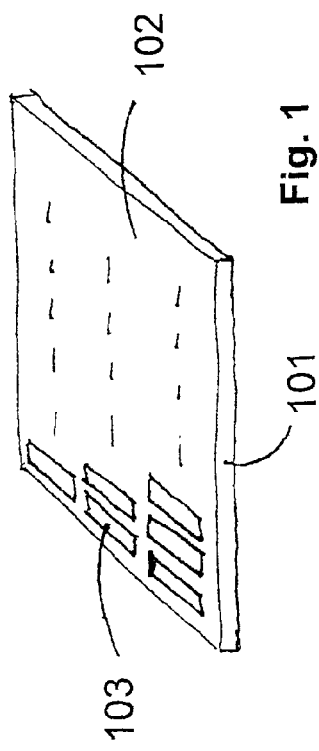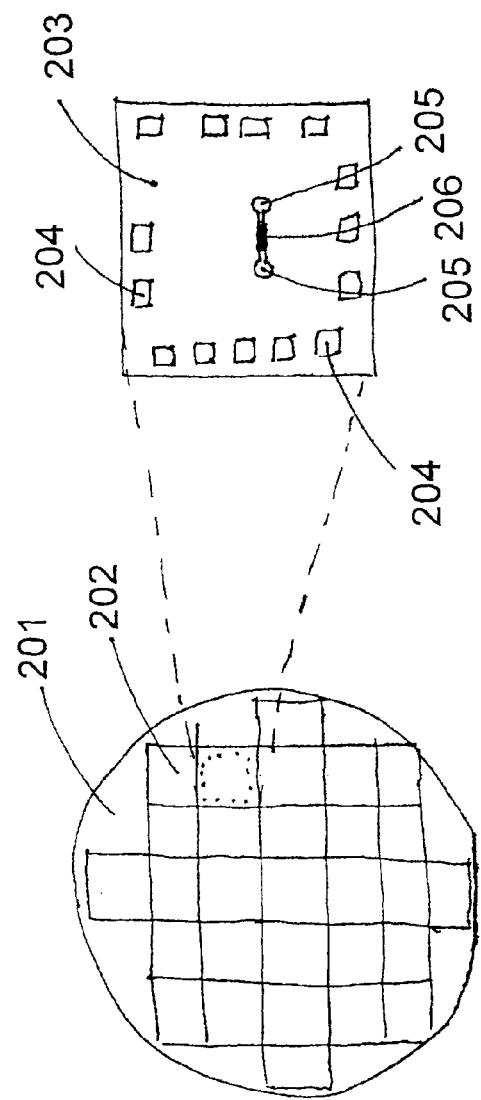

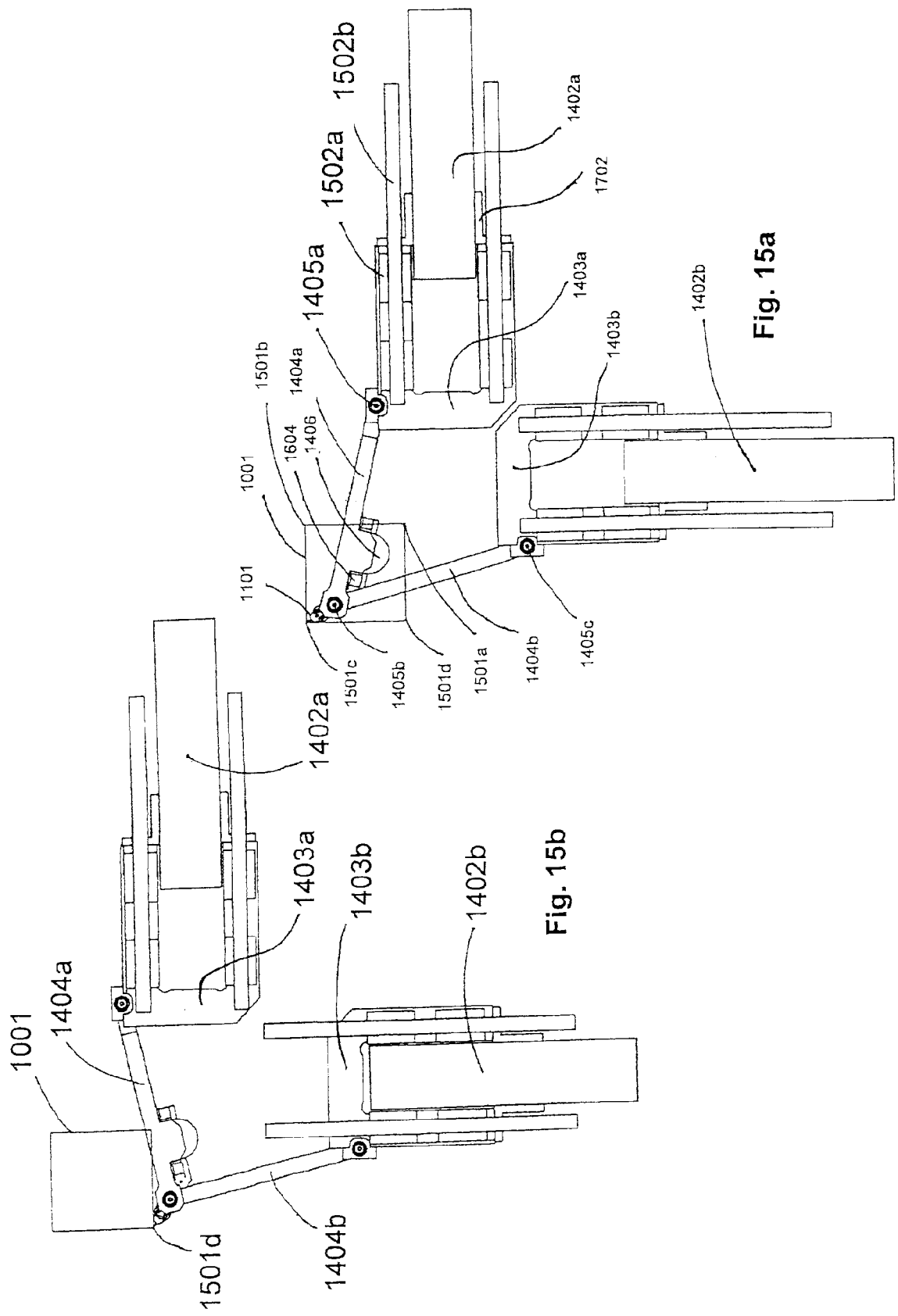

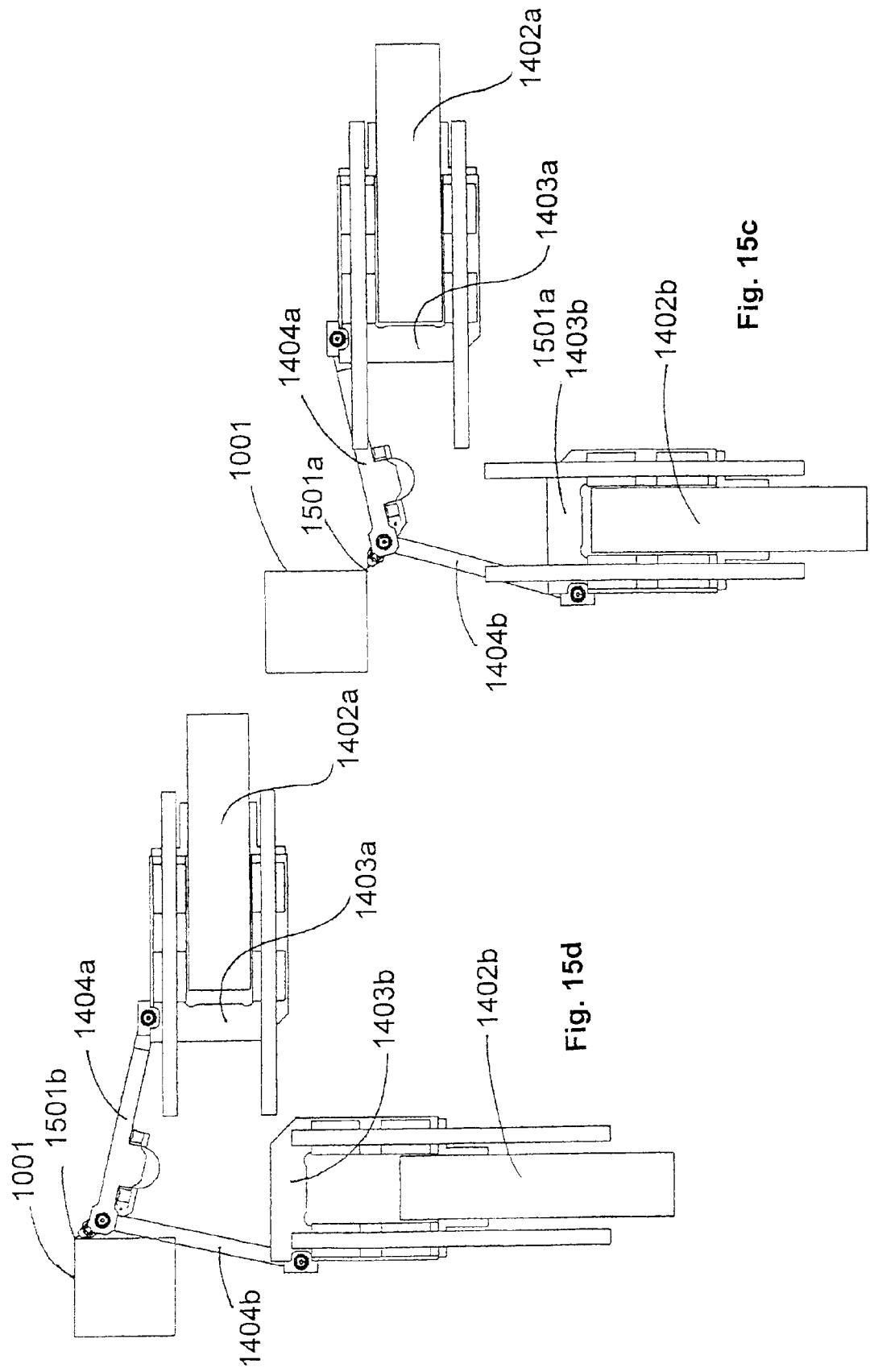

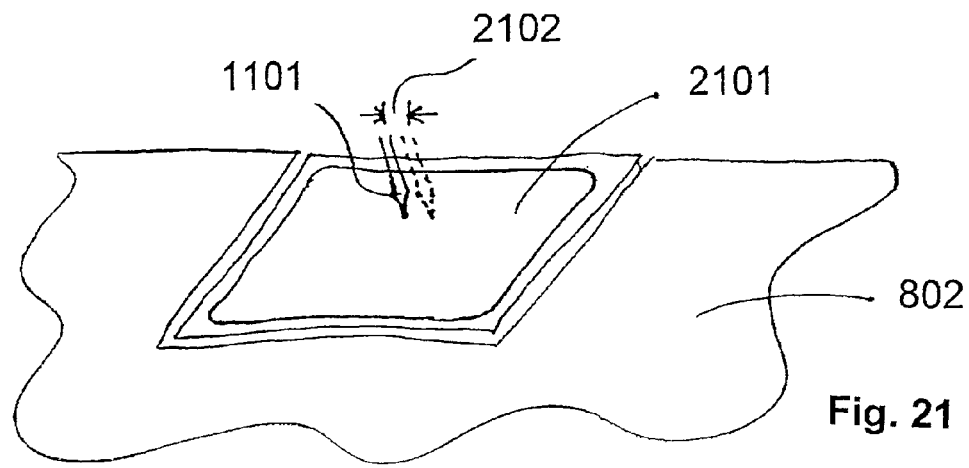
Fig. 21
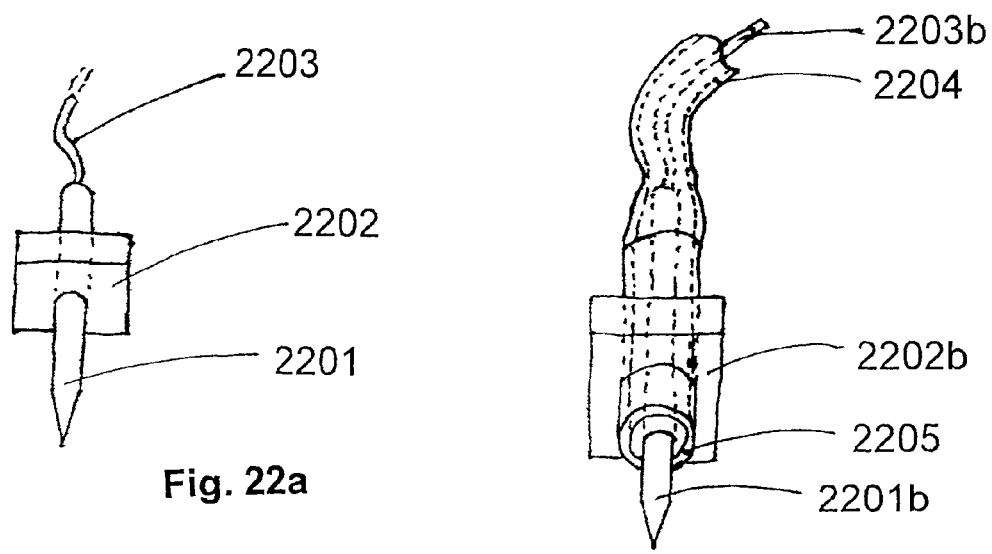
Fig. 22a
Fig. 22b
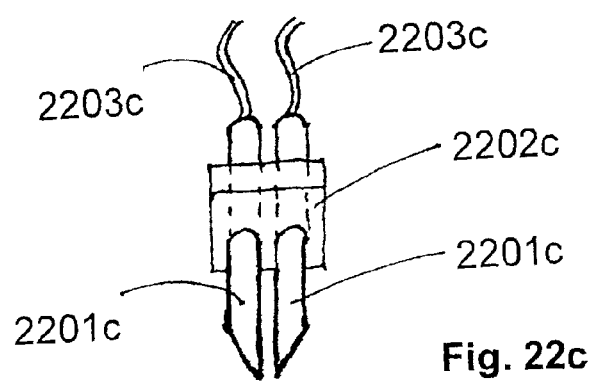
Fig. 22c

SYSTEM AND METHOD FOR PROBING WORK PIECES

This application claims the benefit of U.S. Provisional Patent Application Ser. No. 60/947,246 filed Jun. 29, 2007.

TECHNICAL FIELD

The present invention relates generally to probing of a work piece, and more particularly to probing a work piece using a moveable probe.

BACKGROUND ART

It is well known in the semiconductor and electronics industry to require electrical testing of circuits to ensure product quality and reliability at various stages through the manufacturing cycle. Typically, finished electronic products are comprised of passive circuit elements such as resistors and capacitors, and active semiconductor devices such as transistors and integrated circuits, all interconnected and usually physically mounted on a substrate providing mechanical support and electrical interconnection. The electrical testing is required to verify that the parts of the circuit, from individual elements to complete assemblies, demonstrate performance characteristics within design limits. For example, the conductivity of a conductive circuit trace may be tested to verify a minimum value of conductivity as well as minimum isolation from other circuit elements. Another example is the testing of resistors to measure that the actual resistance is within prescribed tolerance limits.

Since the early 1970's electronic circuits called Hybrid Circuits have been built on ceramic plates or substrates because they require very stable or high temperature operation, or high frequency operation. Passive components such as resistors are made directly on these circuits by printing and baking a partially conductive paste between the conducting traces. Typical circuits manufactured as Hybrid Circuit Boards (HCBs) include automotive engine sensors, military and aerospace components, and high frequency circuits. In the last 10-15 years with the increasing use of surface mount (SMT) components on PCBs, resistors and other passive components have been fabricated in a similar way. Today, SMT "chip" resistors are made by forming many resistors on a ceramic plate and then breaking this plate up into smaller individual components for soldering onto a PCB surface.

A Printed Circuit Board (PCB) is typically comprised of alternating layers of copper and polymer resin. The polymer resin may or may not be reinforced for improved mechanical and thermal properties by woven glass fibers or other inorganic fillers. A subset of these types of substrates is the common rigid boards used as "motherboards" in computers and cellular telephones. Another subset of PCBs is flexible circuits based on polyimide or other flexible dielectric materials, and used for interconnections requiring the ability to flex along one or more axes.

Semiconductor circuits are typically comprised of a base substrate processed as a wafer, such as silicon or other semiconducting material, and later diced up into individual integrated circuits (ICs) called die. Circuit elements such as transistors, resistors and capacitors are built up through varied processes including layer deposition, patterning using photolithography, implantation, and metallization. Connections to the IC are typically made at surface pads which may lie near the edges of the die, or in an array cross the surface of the die as in a Flip Chip design.

Many complete electronic circuits are comprised of several of these circuit "boards" connected together or mounted on one another. For example, a computer microprocessor die may be mounted on a small PCB comparable to the size of the silicon die, and this package, termed a Chip Scale Package (CSP) is in turn mounted to the main PCB connecting to other devices. Often this small PCB is termed an "interposer" board. Another example is the soldering of high frequency hybrid circuit to a low frequency base PCB such as commonly employed in wireless devices.

In most cases, it is economically advantageous to perform electrical testing at the device or sub-component level, so that the value of rejected parts is as low as possible. Thus, as examples, electrical testing is performed during the manufacture of chip resistors that are later soldered to PCBs, CSP interposer PCBs are tested before the silicon dies are attached, and integrated circuits may be tested before dicing.

In the early 1990's some PCB manufacturers started to explore using a similar technique as that used in making HCB resistors to fabricate resistors directly on PCBs. They formed the copper traces first, and then screen printed and oven cured a paste between trace pads to form the component. At first, this technique was used to form passive components on the surface of the PCB, but by the mid 90's PCB manufacturer's realized that they could place these components on any layer including the inner layers of a multi-layer PCB. Thus during the build up of a PCB's layers, insulating and copper layers could be laminated on top of sheets with already-formed resistors or capacitors. Connections to these components are made through copper-plated holes from one layer to another in the same way that layers in a multi-layer PCB are connected. This technique is termed "Embedded Passive" (EP) technology since the elements are effectively embedded within the PCB itself.

The equipment and processes involved in forming these embedded passive components is very similar to that required for forming resistors on HCBs, although parameters for the lamination, screen printing, curing and other processes are different due to the different materials—ceramics vs. polymers—involved.

Embedded passive technology has the ability to address design challenges which require decreasing overall circuit size, increasing production yields, lowering manufacturing cost, and improving electromagnetic interference (EMI) performance of new circuit designs with higher clock frequencies. By embedding the passive components inside the PCB, up to 30% of the surface area (PCB size) can be reduced. Alternately, this real estate can be used by semiconductor chips to realise extra functionality within the same overall size. Since there is no longer a requirement to solder extremely small components, the yield for the finished PCB can increase. Since the fabrication of the embedded components is a batch process using standard PCB production techniques, the overall cost of the finished product can be reduced relative to using discrete SMT components. By embedding the components within the PCB, high frequency signals can remain shielded by outer copper layers, thereby reducing radiated fields (EMI).

Laser Trimming

Typical manufacturing processes for resistors, capacitors and other passive components such as inductors are characterized by associated tolerances and uncertainties. For example, thick film screen printed resistors on HCBs and PCBs have a resistance value after curing that varies with paste thickness, profile, uniformity, composition, dimensional control, and curing cycle, among other factors. Although the materials and processes used are very different, similar process variances exist for resistors formed as part of analog integrated circuits on semiconductor wafers. Each of these process variables adds to create both a mean and a standard deviation in the distribution of the statistical resistance values. In typical production of thick film resistors, for example, the resistance of a resistor may vary by typically +/−20% across a single board and from batch to batch. A circuit design may call for a tolerance on some components of better than 1%, which is not achievable by this manufacturing process. Thus additional manufacturing processes are added to bring the accuracy and precision of the resistance values within the required design tolerances.

The most prevalent technique used to resolve the issue of accuracy is laser trimming. Laser trimming is a mature technology that has been used since the 1980's in the manufacture of precision electronic components such as Hybrid Circuits, Semiconductors, and chip resistors. SMT chip resistors are typically laser trimmed to value prior to being broken into "chip" form for soldering onto PCBs. Laser trimming can bring an as-manufactured tolerance of +/−20% down to better than +/−1% and beyond.

Trimming of circuit elements to target value is accomplished using a laser to cut, ablate, or otherwise modify the element material. Laser trimming of a resistor typically works by making a small cut into the resistive material such that the resistance value changes. A similar technique is used in the trimming of capacitors, where the surface area of one or more conductive layers is reduced. These processes have been well characterised for different materials and over many years.

Laser Trim Probing and Testing

Test operations are undertaken during the manufacture of HCBs, embedded passive PCB's, and semiconductor wafers to ensure final product yield and specification. During the laser trimming operation, for example, the component being trimmed is typically measured to control the amount that is trimmed so that the value (e.g. resistance of a resistor) at the end of the trimming matches the required value and tolerance.

A means for electrically probing the component during this trimming operation is required. A measurement system is typically attached to several probe fingers that contact the circuit and measures the value of the required electrical parameter (e.g. resistance). A probing fixture, or "probe card", containing a fixed pattern of probes that matches the circuit layout are typically used to test circuit design and have been custom built for each circuit design.

Probe card manufacturing is a highly manual process. The layout of each probe and the mounting, typically by soldering, of each probe tip is done by hand. The cards are typically expensive, with a cost of USD $1000-$2000 each, and have a production life of only 1-4 weeks. Furthermore, the probe cards used in trimming equipment are not currently used by PCB manufacturers for any other processes, so additional investment by PCB manufacturers is required.

The fixed probe card is applicable where the circuit substrate or work piece is small and the volume of parts being tested is very high (e.g. SMT chip resistors), but has drawbacks when applied to HCBs and PCBs. These drawbacks may include, for example:

Circuit size is limited. The circuits may be larger than the small probing area, which is typically only 50-100 mm in size. As a result, more than one probe fixture may be required to test a circuit, increasing operating costs and making full trim and test automation difficult if not impossible. This is especially true for testing and trimming on PCBs since the typical circuit sizes can be larger than that on HCBs.

Probe density is limited. Fixed probe cards used in trimming systems must be carefully designed for each circuit layout to make sure all the test pads of the circuit to be tested can be probed and the probes do not shadow the resistors to be trimmed. For dense circuits, it may not be possible to make a probe card that can probe all of the required pads while not shadowing the tested elements.

Circuit layout is restricted. It is often desirable, for reasons of balanced copper density across a work piece of circuits, to alternate, rotate, or mirror the layout of individual circuit cards on a multi-up work piece. In this case, a fixed probe card would need to be provided with a means to rotate, typically by 90, 180, or 270 degrees in order to probe all of the circuits on a work piece. This can not only adds cost and complexity to the testing equipment, but can also add wasted overhead time during repositioning of the probe card.

Circuit designs can change frequently. As a result, the probe cards must be reworked or newly constructed with each small circuit layout modification, adding to delays and increasing cost.

The lead time to procure probe cards is typically several weeks, limiting quick-turn production. An alternative is for the user of the equipment (i.e. manufacturer) to invest in personnel and equipment to make these cards, but this too is costly and the learning curve is a barrier.

The probe card life is short. This means that typically 2-3 identical cards should be on hand to allow for both replacement during production and the lead time to replace a spare card. This can be a significant investment, especially for the production of small batches. Furthermore, once a circuit design production run is completed, the probe cards are no longer useful for a new design. Using a two week average probe card life and including the need for at least two probe cards per machine per design, the operating cost for probes can be greater than US $30 k per machine per year.

Throughput is low. For small circuits, probing density limitations mean that only a small area of the trimming and probing field can actually be used. The step-and-repeat time to move the probe card from circuit to circuit makes the overall trimming speed low for work pieces with a large number of small circuits.

High frequency measurement not practical. Many emerging circuit designs operate at high frequencies, such as memory bus bandwidths reaching 1 GHz, and RF circuits for wireless devices in the several to tens of GHz region. To accurately test and laser trim circuit elements such as resistors, capacitors and inductors, as well as for active circuit functional test, it is beneficial to perform measurements of elements' impedance under the same conditions as the operating conditions. This means probing at high frequencies, and usually requires probes with specialized tips and coaxial or strip-line conductor connections to the measurement system. These types of probes are routinely used in fixed designs and manual test environments where probe cost is not a significant concern. However, for application as described above, where multiple designs, frequent design changes, and consumable probe cards are required, use of these probes is not physically or financially practical.

The preceding issues of capability, flexibility, throughput, and cost of fixed probe based test equipment present significant barriers for manufacturing, especially for embedded passives PCBs.

PCB Testing

Most PCB production includes final test of the integrity of the finished product. This typically means electrically testing each circuit trace patterned into the board to make sure that it conducts properly from one end to the other, and that it is not shorted to another circuit trace. The final PCB productivity yield is only obtained after this testing has been done, and the test is extremely important since failure of the product after assembly can not be tolerated.

In the past, systems used to test PCBs have been based a "bed of nails" which is essentially a fixture with test points that contact the circuit traces. A measurement system uses these contacts to determine whether the circuit traces pass or fail a series of tests. Due to limitations in the close spacing of the test pads and with an increasing miniaturisation of PCB trace widths and spacing in the mid 1990's, the industry has developed alternative testing systems based on moving or flying probes.

Moving probe test of electronic components performs active testing of a circuit or circuit element such as a resistor, capacitor, inductor, or circuit trace on a substrate such as a HCB or PCB without the need for first building a custom fixture or probe support for measuring the circuit. Instead, other flexible and programmable means, using automated vision systems and moving probes under software control, are used to measure characteristics of the circuit under test.

The flying probe systems work by positioning a probe tip into contact with a circuit trace at each end of the trace path, and with a measurement system connected to the two probes, measure the conductivity of the trace. The probes are then positioned at the next pair of locations, testing is done, and the process repeats for the remaining test elements. This technique allows very finely spaced and accurate automated probing based on programmed probing locations.

Although slower than the "bed of nails" testers, these testers are being used in increasing numbers due to their flexibility and functionality in advanced PCB test. However, there are several disadvantages related to current methods and systems used, when applied to the previously discussed testing requirements for HCBs, PCBs, and CSP PCBs.

Existing Flying probe test equipment is typically used to perform electrical test on full size multi-circuit PCB work pieces, which may be up to 21"×25" in size, or sections of medium sized cards of several circuits. In any case, the test equipment is typically designed with the ability to position the probe tips over a large area similar to the maximum size of the PCB work piece. The methods and systems for this probing typically incorporate gantry or other large travel motion techniques to allow positioning over the required area. Due to the large moving masses resulting from this technique, the time to reposition a probe tip from one test pad to another pad location is relatively long. The resulting low test throughput is limiting the widespread use of the Flying probe technique in volume production. CSP substrate production is a very high volume application for test equipment, and thus an improved probing method would be advantageous for this application.

Beyond the throughput issues described above, a further disadvantage of the application of existing flying probe techniques to trimming relates to the probe clearance during trimming operations. Conventional electrical testing does not require optical access to the element being tested, as is required during trimming, and the element is typically obscured by the more massive probe body that holds the probe tip in past flying probe systems. Since the laser trimming process requires an optical path to the element being tested, the existing Flying probe techniques are not readily applicable. It should be noted that the fixed probe cards currently in use in laser trimming systems are expressly designed to avoid this problem, but thereby impose the other limitations related to circuit layout described above.

Thus there arises the need for an improved probing system and method that overcomes limitations of existing techniques of probing work pieces

SUMMARY OF THE INVENTION

In accordance with the present disclosure there is provided system for probing work pieces that include circuit elements, such as resistors, capacitors or other passive or active circuit elements. A system according to an embodiment of the present disclosure may provide the ability to probe and test circuits of an arbitrary size and component density, as compared to previous fixed probe system which typically use a circuit card or fixture, for probes and as such have a limit on maximum circuit size and probe pad density that can be probed or tested.

A system according to an embodiment of the present disclosure may also provide the ability to probe and test circuits at high speed, independent of circuit size and component density. The probe subsystem uses orthogonal forcers, or actuators, pivotally coupled to a probe holder to reduce the weight that is required to move, allowing for quicker acceleration and deceleration of the probe tip holder.

A system according to an embodiment of the present disclosure may further provide the ability to probe and test circuits using an independently programmable probes to provide quick and flexible operation for new circuit designs. A system according to an embodiment of the present disclosure eliminates the use of manual fixed probe cards. Probe cards must not only be custom made, but must also be inserted and aligned within a probing or testing machine prior to use and during replacement.

A system according to an embodiment of the present disclosure may still further provide the ability to probe and test circuit elements in a laser trimming context. The probe system provides optical clearance for a laser trimming beam without the probes of the system shielding circuit element(s) being trimmed.

In accordance with an embodiment of the present disclosure there is provided a system for probing components on a surface of a work piece. The system comprises a support structure and a probe subsystem coupled to the support structure. The a probe subsystem comprises a first and second arm each having a pivot point and a guide end, the first arm and the second arm pivotally coupled together at the respective pivot points, a probe tip holder coupled to at least one of the first arm or the second arm and a guide means for guiding movement of the guide ends of the pivotally coupled arms, such that movement of the guide end of the first arm and the second arm move the probe tip holder in a plane parallel to the work piece surface.

In accordance with an embodiment of the present disclosure there is provided a method for probing components on a surface of a work piece. The method comprises holding a work piece surface in a fixed position at least partially within a plane, moving guide ends of first and second arms that are pivotally coupled to each other such that movement of the guide ends move a probe tip coupled to one of the first arm or the second arm with in the plane, and moving the probe tip in a direction perpendicular to the plane such that the probe tip contacts the surface of the work piece.

In accordance with an embodiment of the present disclosure there is provided a method of manufacturing a system for probing components on a surface of a work piece. The method comprising providing a support structure, coupling a work piece subsystem to the support structure and coupling a probe subsystem to the support structure. Coupling the work piece subsystem comprises providing a work piece fixture for holding the work piece surface in a fixed position at least partially within a plane, the fixed position fixed relative to the work piece fixture. Coupling the probe subsystem to the support comprises providing a first arm having a first probe end and a first guide end, the first guide end adapted for movement in a first direction generally parallel to the plane, providing a second arm having a second guide end and a second probe end the second guide end adapted for movement in a second direction generally orthogonal to the first direction and generally parallel to the plane, pivotally coupling the first probe with the second probe end, and coupling a probe tip holder to one of the first arm or the second arm, the probe tip holder adapted to hold a probe tip adjacent the work piece surface.

In accordance with the present disclosure there is provided an automated probe tip exchange system for exchanging probe tips. The automated probe tip exchange system comprises a means for affecting the release of a probe tip from a probe tip holder, and a means for inserting and securing a second probe tip in the probe tip holder.

In accordance with the present disclosure there is provided a method of calibrating the location of a probe tip in a probe module. The method comprises locating a calibrating plate at a known location, probing the calibrating plate to determine the location of calibrating features, and correlating the known location of the features to coordinates of a probe tip.

BRIEF DESCRIPTION OF THE DRAWINGS

Embodiment of a system and method for probing work pieces is described with reference to the drawings in which:

FIGS. 1-4 depict exemplary work pieces;

FIGS. 15a-15d depict exemplary movement of a probe in accordance with the present disclosure;

FIG. 21 depicts an exemplary scrub pad in accordance with the present disclosure;

FIGS. 22a-22c depict exemplary probe tips in accordance with the present disclosure;

DETAILED DESCRIPTION

Work Pieces

Figure 3:
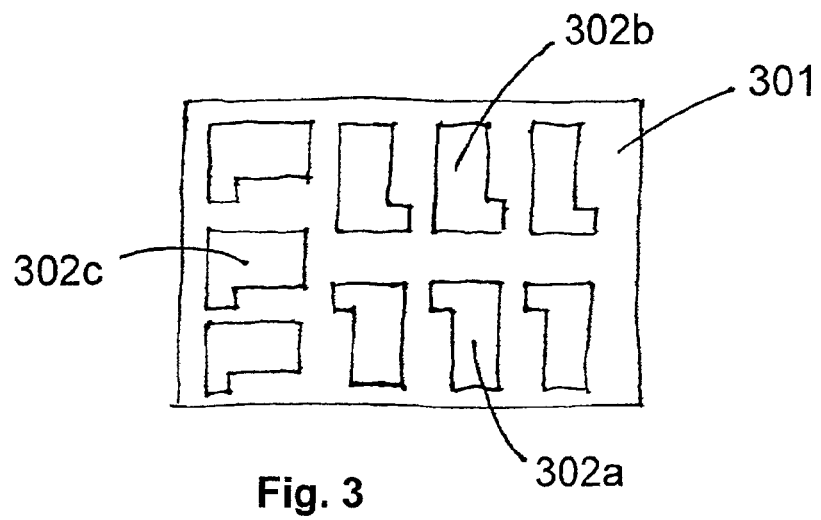

FIG. 1 depicts a typical Hybrid Circuit Board (HCB) work piece or typical Printed Circuit board (PCB) work piece or work piece 101 including circuit elements 103 exposed on its surface 102. FIG. 2 depicts a typical integrated circuit (IC) wafer or work piece 201 including multiple circuits 202. As used herein, a work piece or work piece is a substrate. In the exemplary embodiments described below, the substrate is for forming finished circuits boards, whether HCBs or PCBs, and integrated circuits (ICs). The finished circuit boards will typically include at least one dielectric layer or dielectric substrate, at least one conductive layer or conductive substrate, and optionally untrimmed circuit elements formed thereon. In the case of a Printed Circuit Board (PCB), the dielectric layer may be formed from an epoxy resin having fiberglass filler or other known dielectric substrate material used in PCB fabrication. One example of a dielectric layer material is the material FR4 available from several suppliers. In the case of a Hybrid Circuit (HC), the dielectric layer may be formed from a ceramic material optionally having fillers or other known dielectric substrate material used in HC fabrication. One example of a common HC substrate dielectric material is Aluminum Oxide ($Al_2O_3$) often referred to as Alumina and available from several suppliers. One example of a common IC dielectric material is Silicon Dioxide ($SiO_2$), which is readily formed on Silicon substrates. The conductive layer may include a copper layer that is laminated or otherwise deposited on the dielectric layer, or Aluminum or Copper metallization in the case if ICs. Typically, the dielectric layer has a thickness in the range of about 0.025-1.5 mm and the conductive layer is thinner, usually in the range of 0.1 µm to 50 µm thick. The circuit element may include at least one conductive path, resistor, capacitor or inductor formed contiguous with one of the dielectric or conductive layers or both. An untrimmed element may also include a portion of the dielectric layer or a portion of the conductive or semi-conducting layer, or both, as is the case for a capacitor.

Figure 4:
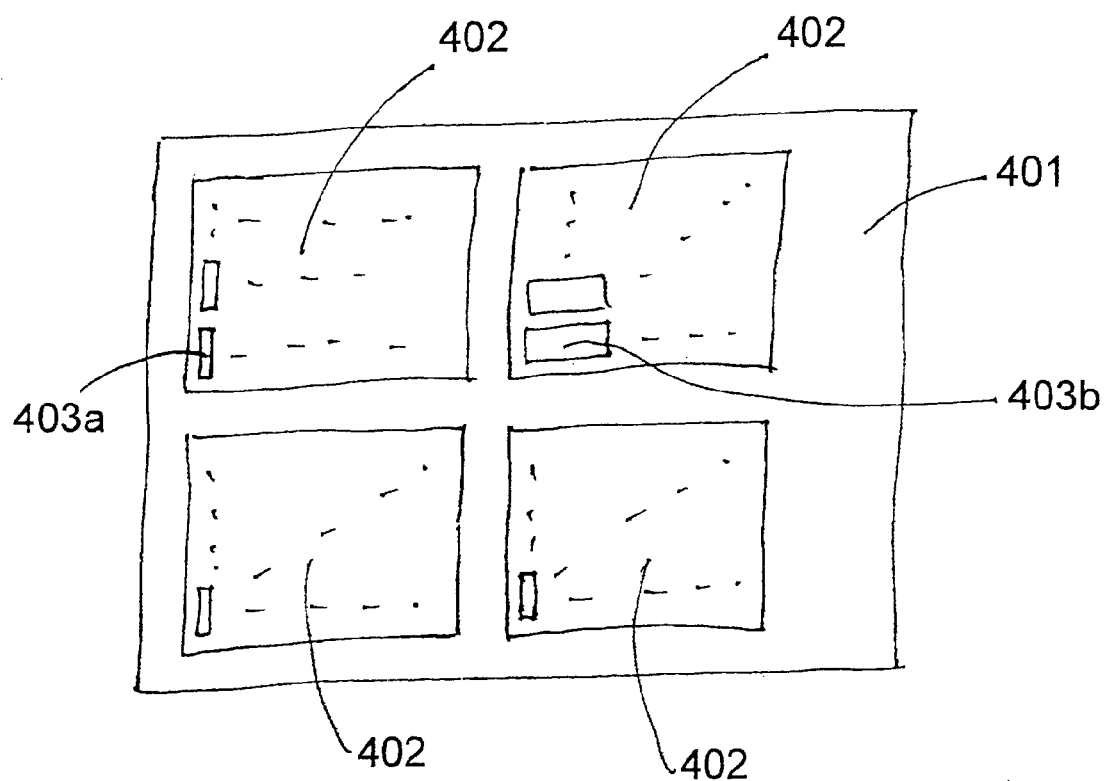

A work piece or wafer includes at least one conductive path formed by the conductive layer. The conductive path may form a portion of an electronic circuit to be formed in a finished circuit fabricated from the work piece or wafer. The conductive path may include portions of a plurality of conductive layers formed on a single substrate, such as in a multi-layer PCB. A work piece may be used as a substrate for forming a plurality of substantially identical circuits, formed in a repeated pattern on the work piece as shown in FIG. 1 and FIG. 2. Alternatively, a work piece may be used as a substrate for forming a single circuit e.g. a computer mother board. A still further alternative is for a work piece to be used as a substrate for fabricating a plurality of different circuits formed in a pattern thereon, or a plurality of substantially identical circuits formed in different orientations thereon as shown in FIG. 3, and further complexity in layout as shown in FIG. 4. A work piece size may be the same as the finished circuit board fabricated therefrom, i.e., a single circuit board is fabricated from a single work piece. Alternatively, a work piece may be cut or otherwise separated to form a plurality of smaller sized finished circuit boards, i.e., multiple circuit boards are fabricated from a single work piece. Although work pieces may be fabricated in any size and/or shape, it is desirable and customary to form work pieces in a rectangular or square shape having dimensions of from about 10×15 inches (254×381 mm) up to about 28×36 inches, (711×914 mm for the case of PCBs, and from about 0.5×0.5 inches (12.7×12.7 mm) up to about 12×12 inches, (300×300 mm) for the case of HCBs. The size of individual circuits within the work piece may range from less than 0.1 inches (2.5 mm) up to the size of the work piece.

Similar considerations apply to semiconductor wafer substrates used to form ICs. Typical wafer sizes range from 2 inches (50 mm) to 12 inches (300 mm) diameter, with individual IC dimensions ranging from less than 1 mm up to 20 mm.

Figure 5:
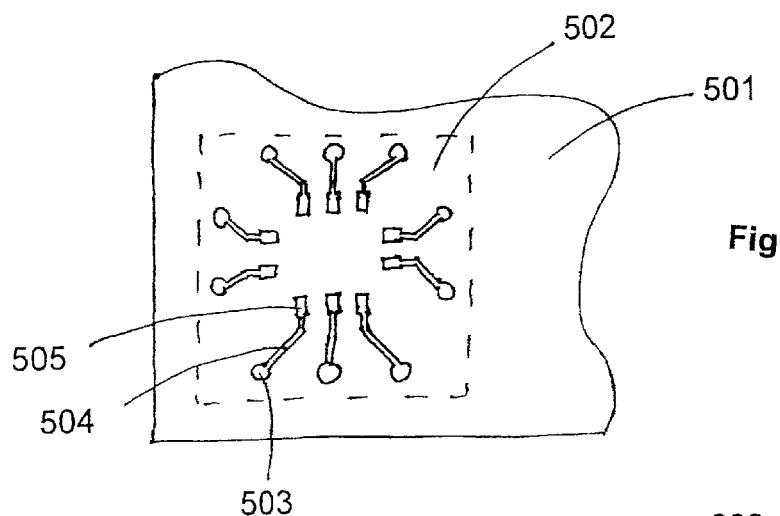
FIGS. 5-6 depict exemplary circuit layouts on a work piece.

FIG. 5 depicts a circuit pattern that may be part of a typical CSP. The circuit 502 is a smaller size than the work piece 501. The electrical conductors 504 are arranged so as to form a conduction path between contact pads 503 and 505. It is a typical requirement in the CSP industry to test for the minimum conductivity between such pads, and to further test for a minimum resistance between non-connected conductors. In this example, electrical signals connected to a measurement system would be applied to pads 503 and 505.

Figure 6:
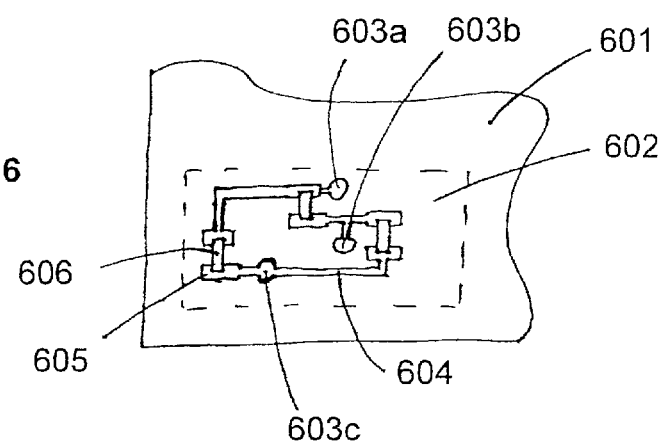

A typical HCB or EP PCB circuit is shown in FIG. 6. Again, the circuit boundary 602 is smaller than the work piece 601. In addition to conductors 604 and contact pads 603, the circuit may contain other elements such as resistors 606 formed between conductor end pads 605. It is a typical requirement in the industry to test for circuit characteristics such as the resistance of the formed resistors by measuring the conductivity between pads 603a and 603b, between pads 603a and 603c, etc.

Figure 7:
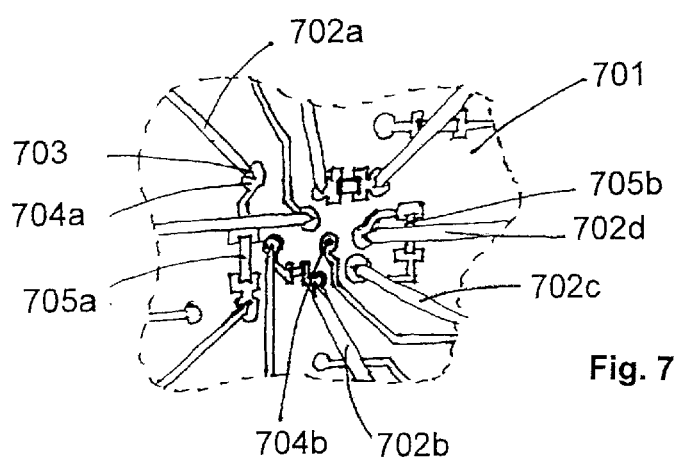
FIG. 7 depicts an exemplary probing arrangement of a circuit.

FIG. 7 represents part of a typical circuit 701 containing conductors, contact pads 704, and resistors 705. The electrical connections for the purpose of test and measurement are made using probes 702. Prior fixture-based measurement techniques required that a plurality of probe tips 703 be arranged so as to simultaneously contact the pads 704.

Using prior art probing and/or trimming systems it may not always be possible to arrange a probe such that it can make contact with a particular pad. Pad 704b is such an example, where any probe would need to cross other probes 702b and 702c. Furthermore, probes of prior art trimming systems may shield elements from a laser trimmer. Where a laser beam is required to impinge upon the circuit element during measurement, the circuit element may be shielded or blocked from the laser beam by the probe. This problem is illustrated in FIG. 7 in the case of resistor 705b which is shielded by probe 702d.

The limitation on layout of circuit elements is further restricted in the case of prior art fixture-based measurement techniques, since the fixture containing the probes 702 is typically aligned in a fixed orientation with respect to the work piece. Circuits 302a, 302b and 302c, or circuits 403a and 403b, are disposed in differing orientations on the work piece 301 and 401 respectively, and thus would require rotation of either the work piece or probes in order to align the probe tips with the probe pads.

The probing system describe herein may be used to probe circuit elements that are arranged on a work piece. As described above, the work piece may include various circuit elements arranged on the work piece in various ways.

Probing System Overview

Figure 8:
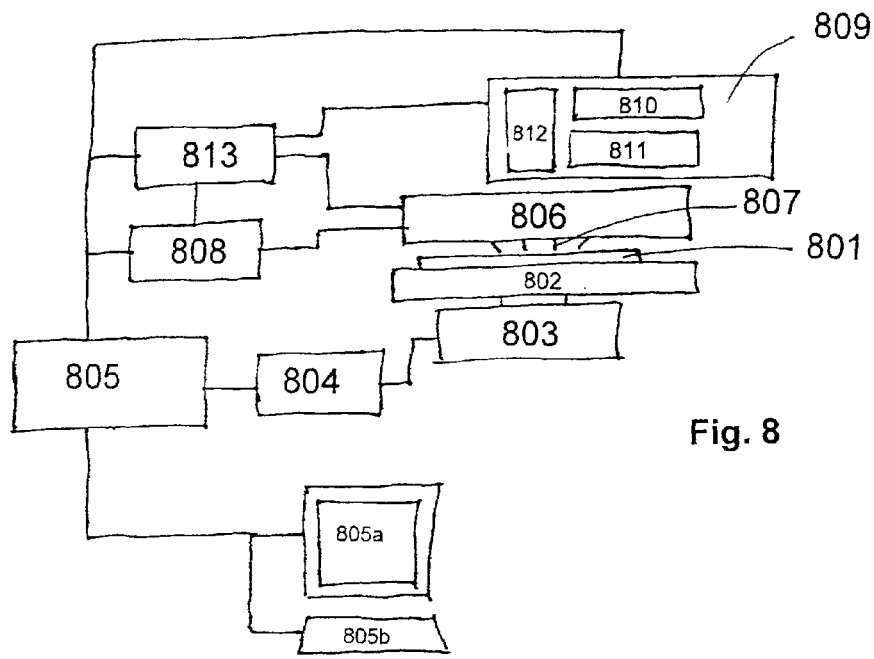
FIG. 8 depicts exemplary components of probing system in accordance with the present disclosure.

FIG. 8 represents a block diagram of an embodiment of a system used in the testing or trimming of circuits. As shown, a work piece 801 is disposed upon a work piece fixture 802. Circuit elements, which could be similar to the circuit elements as described above, may be deposited or otherwise formed on the work piece 801 by any of various material deposition techniques. The work piece fixture 802 may in turn be mounted to a moving portion of a motion subsystem 803. The motion subsystem 803 facilitates the movement of the work piece 801 within the structure of the machine.

The motion subsystem 803 may be configured to provide motion along two generally orthogonal axes within the structure of the machine, providing for an X-Y Cartesian coordinate system for the location of the work piece fixture 802 and hence work piece 801 in a plane parallel to the motion axes. The motion subsystem 803 is mounted to the support structure of the machine, and the machine is typically placed on a stable base such as a floor. The motion subsystem 803 includes motion stages, such as linear motion stages commonly used in many manufacturing systems. These stages provide for accurate relative positioning of the work piece fixture 802 along a linear path.

The stages of the motion subsystem 803 may be configured as a single stage that moves in two orthogonal directions, or as two single axis stages, one mounted orthogonally to the other, to provide the desired motion. The stages may include forcing and guiding means. The motion of each axis is typically provided by a forcing means which may include a stepper or linear motor drive, or a ball-screw, belt or band assembly driven by a rotary motor, or by some other type drive mechanism. The guiding means may be for example a linear bearing or equivalent means.

Each stage may further have associated with each axis of motion a position determining device such as a linear encoder, to determine the actual position of the work piece fixture relative to the support structure. Regardless of whether a position encoder is associated with the axes, the stage(s) of the motion sub system 803 provide precise X-Y positioning of the work piece fixture 802 with respect to a reference position which may be, for example, the center or edges of the work piece fixture 802.

The motion subsystem 803 and the work piece fixture 802 may form a work piece sub system. The work piece fixture 802 holds the work piece in a fixed location relative to the work piece fixture 802. The work piece fixture 802 may hold the work piece using various means, such as clips, clamps, pins, recesses matching the shape of the work piece or other possible means. The work piece fixture 802 may be mounted on the motion subsystem 803 which moves the work piece fixture 802, with the work piece fixed in a location relative to the work piece fixture 802. The motion subsystem 803 may not be required if the probe system, as described further herein, provides sufficient movement of the probes to cover the work piece.

The motion subsystem 803 may also include a stage controller 804 which controls the motion stages. The stage controller 804 typically includes an electrical amplifier or driver used to control the stage forcer. The stage controller 804 may provide for a closed-loop control of the forcer through information fed back to the controller from the position encoder. The stage controller 804 may further be configured to accept commands and provide status information through an interface to another controller such as a system controller 805. With the stage controller 804, the work piece fixture 802 is movable by the X-Y stage(s) of the motion subsystem 803 in the X and Y directions. The stages may move in accordance with X-Y stage control signals issued by the stage controller 804, based on directives received from the system controller 805 via a connection which may be any type of communications link.

Also depicted in FIG. 8 is a probing subsystem 806, which may be termed probe subsystem or prober for simplicity. The prober 806 is positioned proximate to, but not mounted to, the work piece fixture 803. The probing subsystem 806 is mounted to the support structure of the machine, to which also is fixed the work piece subsystem, including the work piece fixture 802 and the motion subsystem if present, described above. This provides for relative motion between the work piece fixture 802, and hence the work piece 801, and the probing subsystem. The probing subsystem 806 includes a probe tip holder 807 for holding probe tips and a support frame or mounting plate for the various components that comprise the subsystem 806. The prober 806 is mounted within the machine such that the probe tip holder 807 positions the probe tip proximate to the work piece 801. Specifically, the prober 806 is configured to provide a means for movement of the probe tip holder 807 along axes of relative motion. The probe tip holder 807 is moved by forcer means that are pivotally coupled to the probe tip holder 807. The forcer means provide orthogonal forces to the probe tip holder 807. The pivotal coupling of the forcer means translates the orthogonal forces of the forcing means into movement of the probe tip holder 807 within a plane that is generally parallel to the plane of the work piece surface.

The forcer means may be pivotally coupled to the probe tip holder in various ways. For example the forcer means may be couple to arms that are in turn each pivotally coupled to the probe tip holder. Alternatively, the forcer means may be coupled to arms that are pivotally coupled to each other, either directly or through an intermediary linkage, with the probe tip holder being coupled to at least one of the arms. The arms may be pivotally connected together at ends of the arms, or they may be pivotally coupled together at a location along the length of the arm. Regardless of the location of the pivotal coupling, the two arms may be coupled together at respective pivot points.

The probe tip holder 807 may also be moved by a further forcing means that provides movement of the probe tip holder 807 in a direction perpendicular to the plane. Motion of the probe tip holder 807 in the direction perpendicular to the plane, may position the probe tip(s) (held in the probe tip holder 807) in order to bring them into contact with the circuit elements on the work piece 801, or to move the probe tip(s) away from the circuit elements on the surface of the work piece 801.

The probing subsystem 806 is configured to provide a means for the positioning of one or more probe tips 807 within a probing area, called the probing field. The probing field is a plane that lies parallel to the plane of the surface of work piece. If the probing field is smaller than the size of the work piece 801, it may be necessary to move the work piece within the probing field, for example using the motion subsystem 806, in order to probe all of the circuit elements located on the work piece 801. The probing field is typically a square region, but may be other advantageous shape such as a rectangle or circle, depending on the requirements of the application. The probing field represents the possible envelope for probe tip positioning within the testing or trimming system. The probing field is located adjacent the surface of the work piece 801. Motion of the probe tips in the probe tip holder 807, perpendicular to the probing field plane, which may be denoted as along the Z axis assuming the work piece fixture 803 motion occurs in the X-Y plane, is also provided by the probing subsystem 806 with a range of motion that is advantageously larger than the difference between the maximum and minimum work piece thicknesses to be probed within the system. This range of Z motion of the probe tip(s) (in the probe holder 807) provides for the ability to control the positioning of a probe tip with respect to the plane of the surface of any relevant work piece 801, and is also configured to provide additional range so as to allow positioning of the probe tip distal to the work piece surface with sufficient clearance for unimpeded motion of the work piece in the plane of the X-Y motion. This allows the probe tip to move in the X-Y plane without contacting the work piece, or circuit elements on the surface of the work piece. Once the probe tip is positioned in the desired location above the work piece 801, the Z-movement allows the probe tip to contact the circuit element being probed.

As described above, the Z-movement moves the probe tip holder 807 in the Z-direction. Additionally or alternatively the Z-movement may be provided by the motion subsystem 803 which the work piece fixture 802 is mounted on. An additional stage may be provided to the motion subsystem 803 to provide Z-movement of the work piece fixture 802 relative to the probe subsystem 806.

The probing subsystem 806 may be connected to a controller 808 which controls its operation. The probe controller 808 is configured to accept commands, and provide status information through an interface to another controller such as the system controller 805, for positioning of one or more probe tips. The probe controller 808 may also optionally include a measurement system for electrical measurement of circuit characteristics connected to the probe tips held in the probe tip holder 807. Depending on the application requirements, other configurations may use a separate measurement system connected to the probe tips, and interfaced to either the probe controller 808 or system controller 805.

In addition to the probing and testing of circuit elements, the system may also provide laser trimming of the circuit elements being probed or tested. The machine may also include a laser/vision subsystem 809 and laser subsystem controller 813. The laser subsystem 809 includes a laser 810, a laser beam delivery 812, and camera vision system 811. The vision system 811 is configured to provide images of the work piece 801 to the system controller 805. The laser 810 trims the circuit elements to alter their electrical properties as desired.

The laser 810 and laser beam delivery subsystem 812 are configured to provide laser energy typically in the form of a focused spot coincident with the exposed surface of the work piece 801. The beam delivery subsystem 812 is configured to provide a means for the positioning of the laser spot within a process area, called the scan field, whose plane lies parallel to the plane of the work piece surface. The scan field is typically a square region, but may be other advantageous shape such as a rectangle or circle, depending on the needs of the application. The scan field represents the possible envelope for laser spot positioning within the trimming system, and is located adjacent the plane of the surface of the work piece 801. In any case, the scan field is configured to be largely coincident with the probing field, such that the laser beam and probe tips 807 may simultaneously access approximately the same region of the work piece 801. Advantageously the probe tip holder 807 positions the probe tips such that the laser beam is not shielded from the work piece by the probe tip.

The system controller 805 controls and coordinates the functions and operations of the various subsystems that comprise the machine. In particular, the controller 805 provides processing instructions and parameters to, and receives status information from, the motion subsystem controller 804, the probing subsystem controller 808, and other subsystems such as the laser processing and/or vision subsystem 809 within the machine. The system controller 805 may also accept input from, and display relevant operating information to, the user interface. The user interface may be comprised of a keyboard 805b and display monitor 805a, as well as other input and output devices such as a computer mouse, control buttons and indicators on the machine, and external connection means to a data network. The user interface provides for, but is not limited to, the programming and configuration of job data and entry of process parameters, as well as viewing of machine status.

During operation of the testing or trimming system, by moving the work piece fixture 802 and hence the work piece 801, different areas of the work piece 801 can be positioned within the probing field of the probing subsystem 806. By keeping the work piece fixed in each position, the probing subsystem 806 can perform the required probing operations within the respective area of the work piece, which lie within the probing field. The X-Y stages of the motion subsystem 803 are advantageously configured to provide an extent of motion that is sufficient to allow positioning of all areas of the work piece 801 within the probing field. By the repeated repositioning of the work piece within the system, many areas of the work piece may be positioned within the probing field, and in this manner probing and/or trimming of the entire work piece, including some or all of the circuit elements disposed thereon, is possible.

Probe System Configuration

Figure 10:
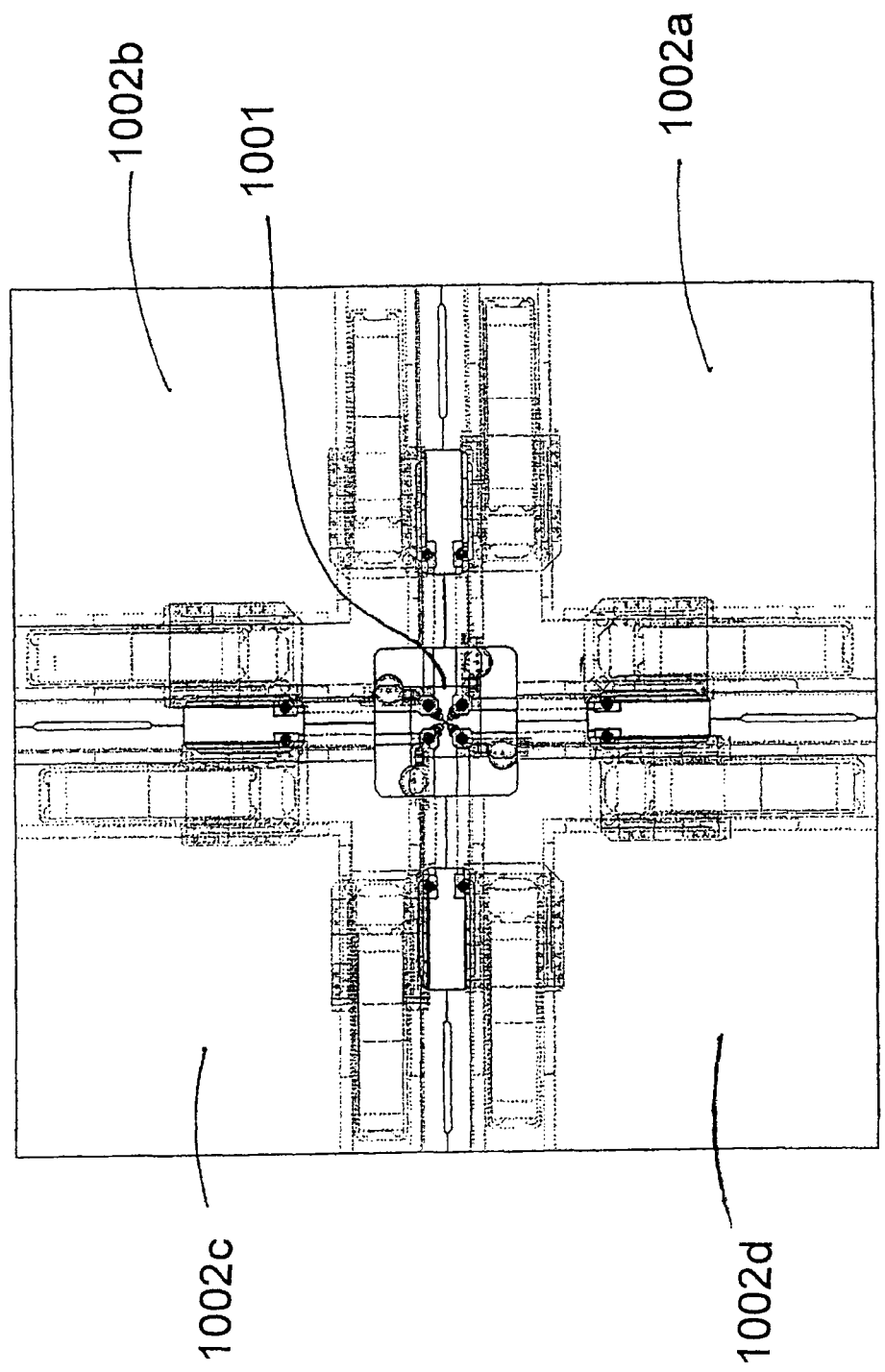
FIG. 10 depicts an exemplary probe subsystem in accordance with the present disclosure.
Figure 11:
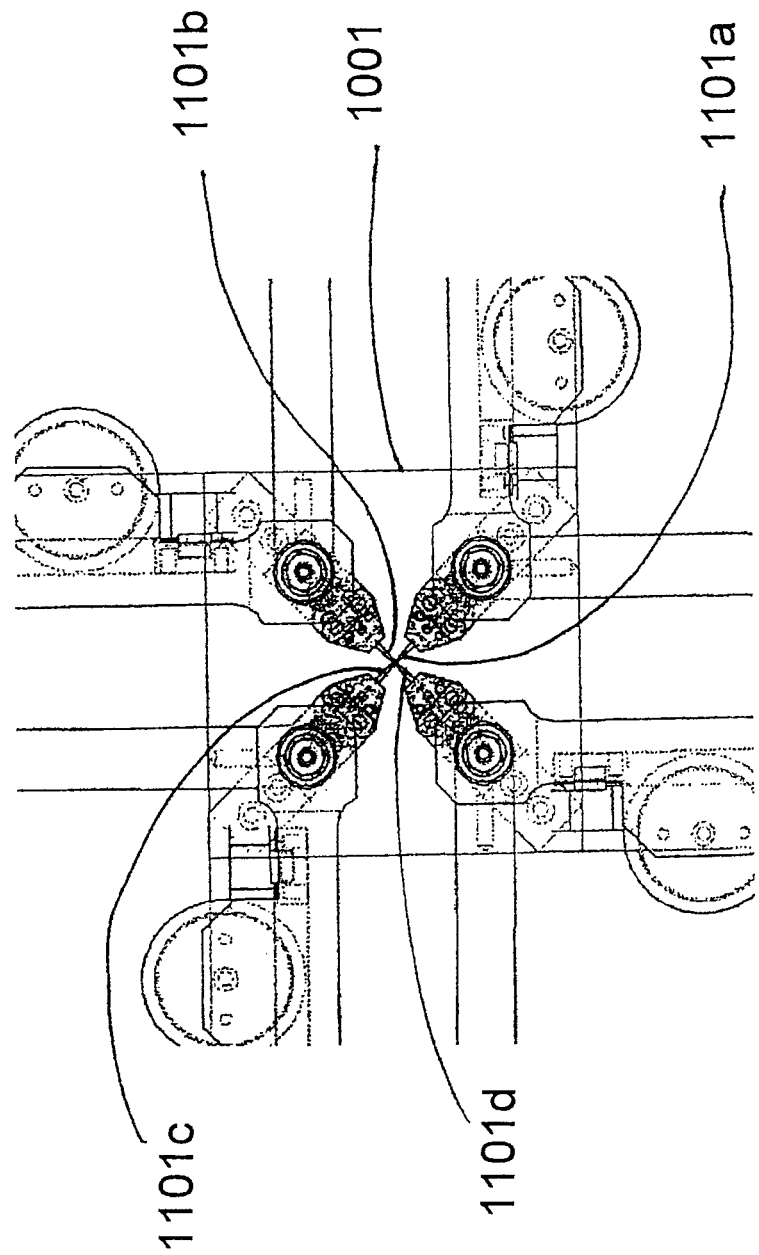
FIGS. 11-12 depict a detailed view of a probing field in accordance with the present disclosure.

An embodiment of the present invention is illustrated in FIG. 10 which details a portion of the probe subsystem 806. FIG. 10 shows a probing field 1001 which is a square equivalent to the probing field discussed above within which probes 807 may be positioned. FIG. 11 shows a detailed view of the probing field 1001 and depicts four probes 1101a, 1101b, 1101c, and 1101d equivalent to probes held by probe holder 807 located within the probing field. This embodiment includes four probes 1101a-d, however the invention is not limited to four probes, and could be configured with one or more probes depending on the needs of the application.

Figure 12:
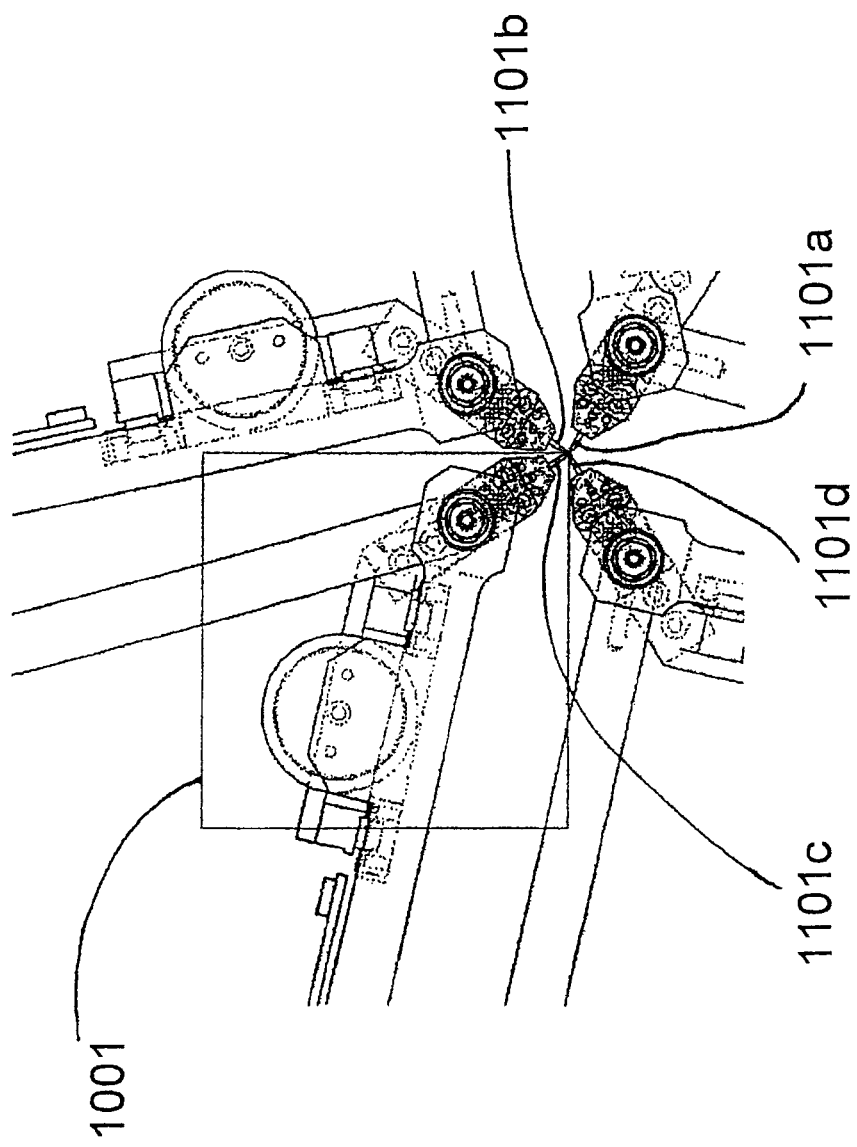

Also shown in FIG. 10 are four probe modules 1002a, 1002b, 1002c, and 1002d that include the four probes 1101 shown in FIG. 11. The probe modules 1002 are independent. Through orthogonal forcer means outlined above, and further described below, each probe module 1002 allows for positioning of the corresponding probe 1101 at any location within the probe field 1001. FIG. 12 shows a view similar to FIG. 11 but with the probes 1101 each moved so as to locate the corresponding probe tip at the same corner of the probe field 1001. In a similar manner, the probes 1101 may be moved to any part of the probe field. Using a system as described herein allows any of the independent probes 1101 to be positioned at any location within the probe field. The probing system controller may control the positioning and movement of the probes to ensure that the probes do not cross each other.

In one embodiment, the four probe modules are identical, but rotated by 90 degrees to form a four-quadrant arrangement, such that the four probes 1101 enter the probe field at generally orthogonal angles. The arrangement of probe modules 1002 within the probe subsystem is preferably chosen to be symmetric for several reasons. Such a symmetric arrangement provides probing of close features by multiple probes from multiple directions at any part of the probe field. It also provides clearance for laser beam and/or vision access to circuit elements even with the probe tips are in proximity to each other. The four-quadrant symmetric arrangement further provides means to probe two pads in any configuration without blocking the laser beam and/or vision access to circuit element(s) distant from probe pads.

Figure 13:
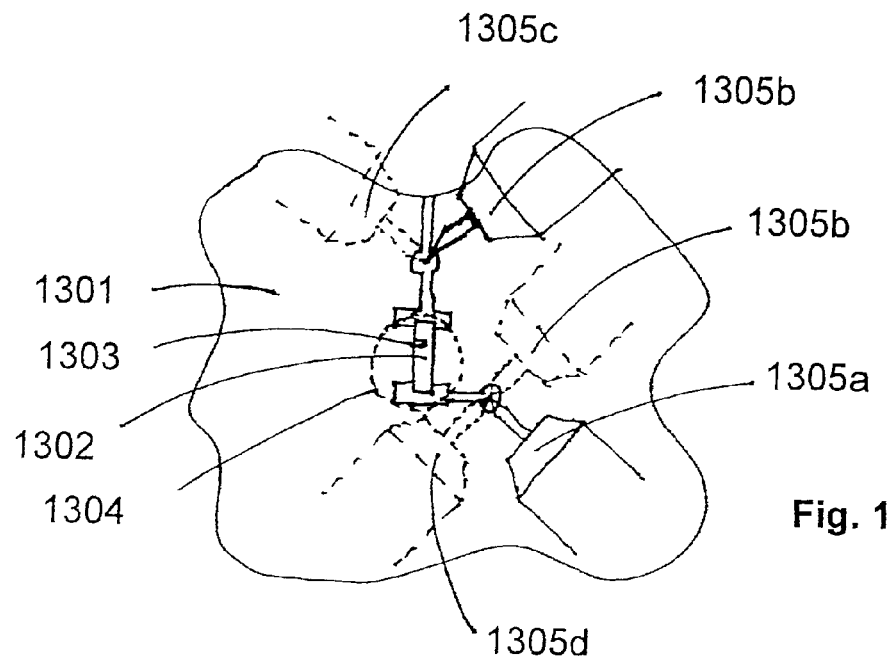
FIG. 13 depicts an enlarged view of an exemplary probe field in accordance with the present disclosure.

FIG. 13 shows an enlarged view of the probe field and work piece 1301 containing a circuit element 1302. Probe holders 1305 are positioned to locate the probe tips over circuit probe pads on the work piece as shown. A choice of which of the four possible probes to locate at which circuit pad location, without covering the circuit element 1302 and without crossing of probe holder 1305, is shown in solid lines. However, it should be noted that other choices for probe use could be made. In this example, the probe held by probe holder 1305a could be substituted with 1305b or 1305d, and 1305c could be substituted with 1305b, as shown in dashed lines. For the case of a trimming system, a cut using the laser beam provided by the laser subsystem 809 would be made in the circuit element 1302.

Based on the geometry shown, a similar scenario may be constructed for any location of circuit element and probe pads within the probe field by using an appropriate combination of probes 1101. It may be seen by those familiar with the art, that the exemplary embodiment described above provides a means to position one or more probe tips at locations of probe pad on a work piece, without blocking visible and/or laser access to the circuit element under test.

Probe Module Configuration

As described above the probing subsystem provides for movement of a probe tip holder within a plane. Multiple probe tips may be provided by coupling probing modules to the support structure of the machine. An embodiment of a probe module 1002 that can be used in the system as described above is depicted in FIG. 14. The probe module 1002 provides both driving (or forcer) and guiding means to enable movement of the probe 1101 in generally orthogonal directions. For the purpose of this description, motion in the horizontal or X-Y plane is considered parallel to both the work piece 801 surface and fixture 802 motion, and motion in the vertical or Z direction is perpendicular to the work piece surface. Each probe module 1002 is controlled by a controller included as part of the probe controller 808.

The probe tip holder 1305 is mounted to a Z forcer support, detailed later, that is driven in the Z direction by a forcer means 1406. The Z forcer is in turn mounted to the drive arm 1404a, which is supported by pivot bearings 1405a and 1405b. Similarly, drive arm 1404b is supported by pivot bearings 1405b and 1405c. The pivot bearings 1405a and 1405c are in turn mounted on forcer supports 1403a and 1403b respectively. These forcer supports are driven by respective forcers 1402a and 1402b along directions parallel to the XY plane.

The motion of the forcer supports 1403 is coupled into the drive arms 1404 through the pivots 1405, effecting motion of the pivot 1405b in the XY plane. Probe holder 1305 is advantageously located proximate to the pivot 1405b such that motion of the probe 1101 in the XY plane closely matches the motion of pivot 1405b. Motion generally along one of the XY directions is provided by a forcer 1402a. Motion generally along the other of the XY directions is provided by forcer 1402b. Motion along the Z axis is provided by forcer 1406. Support for the assembly is provided by plate 1401 which is securely mounted within the machine support structure. Position feedback in the XY motion plane is provided to the controller 808 by encoders 1407.

The encoders 1407 may be of the linear encoder type with a read head 1407a, a linear scale 1407b, and a homing marker 1407c. Other types of feedback devices can be used as a means to control the motion of the probe tip holder 1305. Furthermore, it may be acceptable or advantageous in some applications to provide an open-loop type system where no feedback is provided.

The motion ranges and dimensions of the forcers that provide the force for movement of the probe tip holder, the drive arms that are coupled to the forcers, and the pivots that couple the drive arms together are configured to provide extents of motion that are required to allow probe 1101 positioning over the entire probe field 1001. These design criteria are derived from the required probe field size and shape, which can depend on the application requirements and geometrical constraints. For example, it may be advantageous to provide a large probe field for PCB applications where the probe pad locations and circuit elements may be spaced far apart. It may similarly be advantageous to provide a small probe field for semiconductor applications where the pads and circuit elements are located close to each other within each IC.

Each drive arm 1404a, 1404b may have a probe end and a guide end. The guide end of each drive arm may be pivotally coupled to the forcers that provide orthogonal forces to move the probe tip holder. The probe end of each drive arm are pivotally coupled together. The probe ends may be directly pivotally coupled together as depicted in FIGS. 14 and 15a-d. Alternatively, the probe ends may each be pivotally coupled to an intermediary member, such as the probe tip holder.

The XY motion of the probe 1101 is seen in simplified top views of the probe module 1002 in FIGS. 15a through 15d. The probe 1101 is able to move to all points within the probe field 1001 including the corners 1501a through 1501d. The forcers 1402 act on their respective drive arms and through the pivots 1405a-c to effect an approximate square field of motion between each combination of retracted and extended positions of the forcer supports 1403. The forcer supports 1403 are guided by linear bearings 1502a on rails 1502b parallel to the direction of the force. It should be noted that means of guiding and support other than the bearings 1502 and 1405 may be used to provide similar rigid restraint of the supports and arms other than in their respective degrees of freedom. It should be noted that the motion if the probe tip is not orthogonal with independent motion of the forcers 1402, but instead forms an arc defined by the location of the pivots 1405 and the length of the drive arms 1404. This non-linear motion can be corrected by the controller to provide for accurate XY probe 1101 positioning.

Advantageously embodiments of the system as described here in use an orthogonal forcer means and pivoting drive arms to provide an approximate square field of motion of the probe tip holder, and hence a square probe field may be provided. Using orthogonal forcer means within each probe module provides for the rotational symmetry of multiple probe modules 100, which allows identical probe modules to be combined together in the system by simply rotating the probe module by an appropriate multiple of 90 degrees.

Additionally, geometrically advantageous probe tip positioning is provided through the alignment of the Z axis and probe holder 1305 with the link arm pivot point 1405b. That is, the probe tip holder is adapted to hold the probe tip in alignment with the location of the pivotal coupling of the drive arms, and located on a side of the pivot coupling opposite the drive arms. It may be seen by referring to FIGS. 11 through 13 that such a configuration allows for positioning of two or more probes 1101 at any location in the probe field 1001 without collision or crossing of any of the mechanics of the probe module depicted in FIG. 14.

Figure 16A:
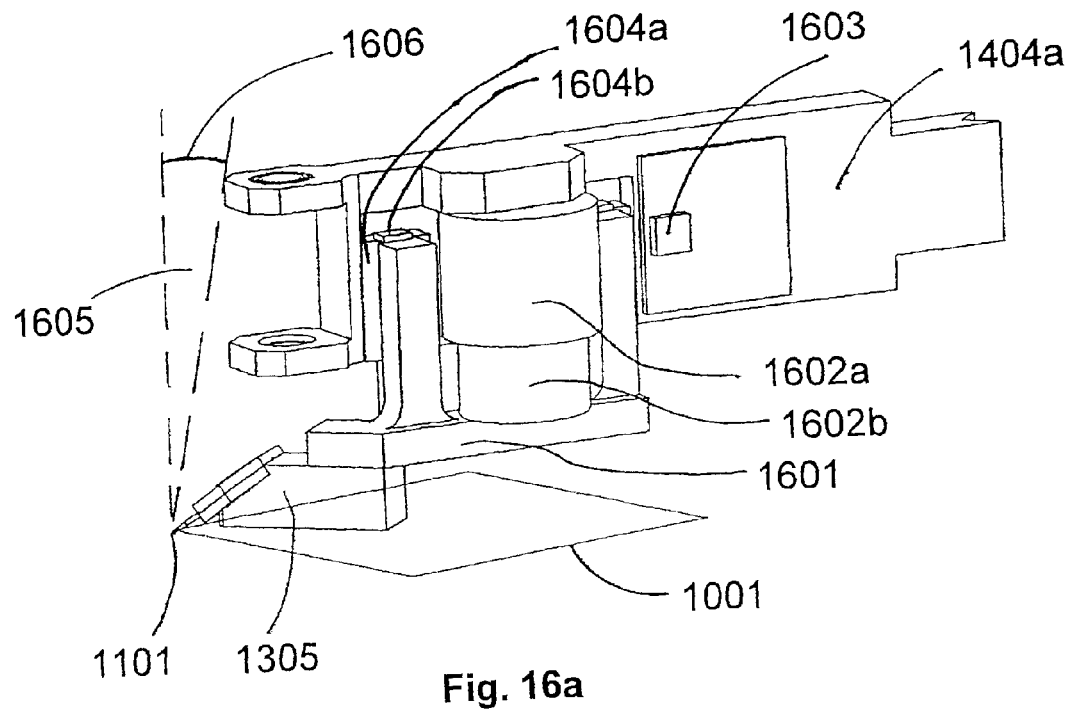
FIGS. 16a-16b depict an exemplary probe tip holder in accordance with the present disclosure.
Figure 16B:
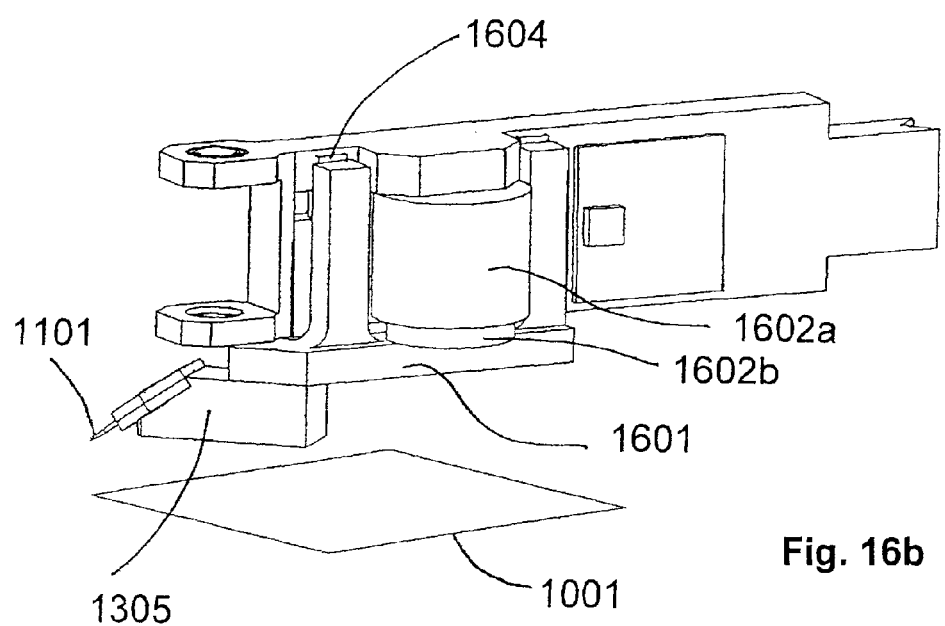

FIGS. 16a and 16b show the motion of the probe 1101 along the Z axis perpendicular to the probe field 1001. The probe holder 1305 is mounted to the Z forcer support 1601 which is guided by guiding means comprising bearing system 1604a on rails 1604b similar to 1502. Feedback of Z position to the probe controller 808 may similarly be derived using encoder 1603. Forcer 1602 extends to drive the probe tip down to the work piece surface coincident with the probe field plane 1001, and retracts as shown in FIG. 16b. When retracted, the probe tip will not be in contact with the work piece, and hence allows for XY motion of the probe in the probe tip holder 1305 without risk of damage to the probe tip 1101 or work piece.

Also detailed in FIG. 16a is the half-angle clearance cone 1605 provided by the probe configuration in this embodiment. At any XY position within the probe field 1001, a minimum cone angle 1606 is provided relative to any module mechanics, in this case to the pivot 1405, for optical clearance in the Z direction. This clearance is required to allow for a focusing laser beam in the case of a trimmer, and/or optical clear aperture for a vision system.

Figure 17:
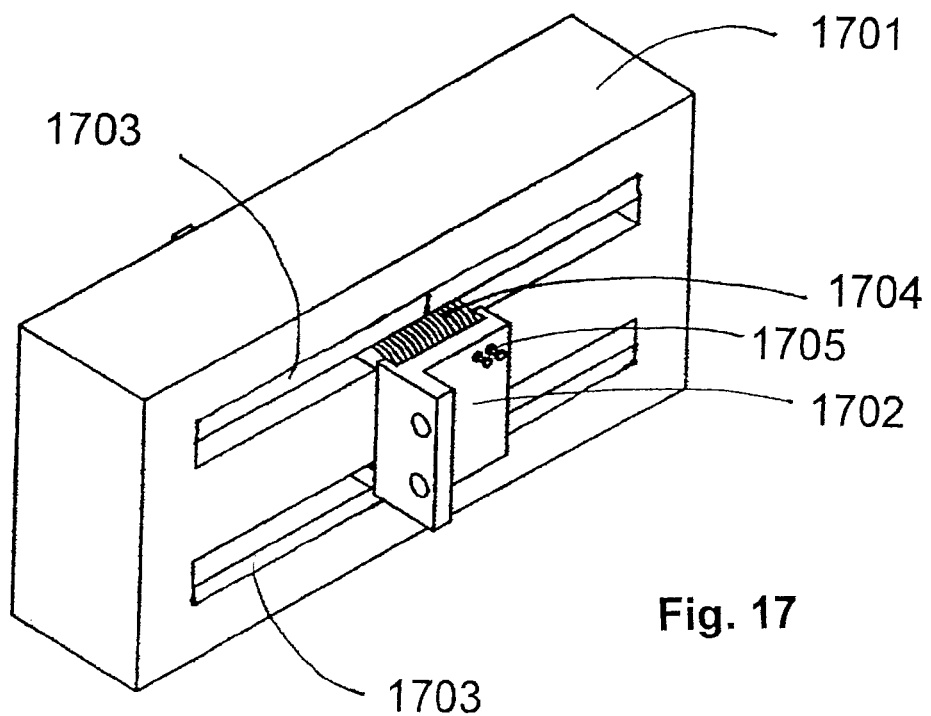
FIG. 17 depicts an exemplary forcer or actuator in accordance with the present disclosure.
Figure 18:
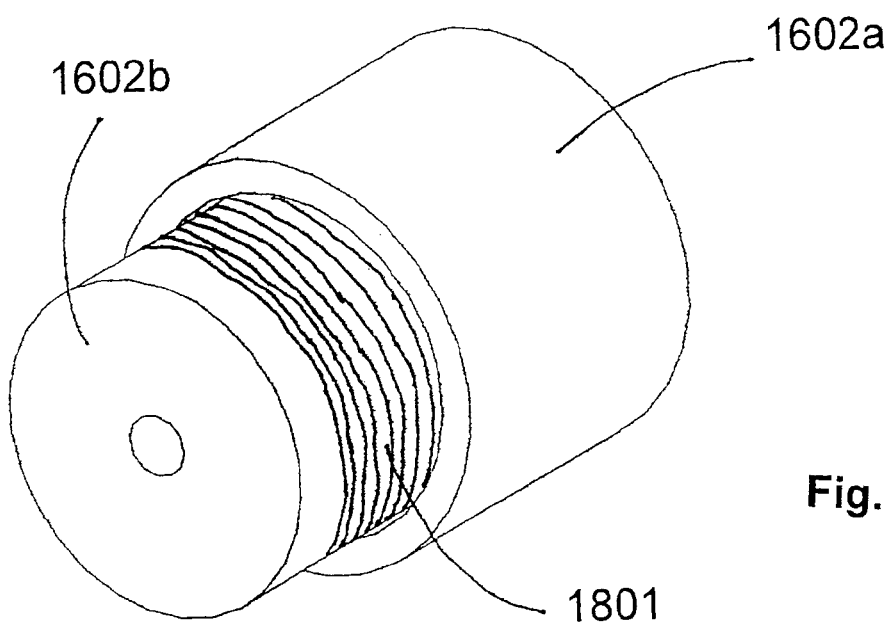
FIG. 18 depicts an exemplary forcer or actuator in accordance with the present disclosure.

FIGS. 17 and 18 show respective details of the XY forcers 1402 and Z forcer 1406 in accordance with an exemplary embodiment. The forcers shown are of the voice coil type, which is a single pole device where the current through a coil produces a force, in the presence of a magnetic field, that is nearly uniform over a range of distance. In FIG. 17 the magnetic field is produced by magnets 1703 and directed by the body 1701 perpendicular to the coil 1704. The force is coupled to mounting flange 1702 which is mounted to forcer support 1403. In FIG. 18 the magnetic field is produced by magnets 1602a and directed perpendicular to the coil 1801. The force is coupled to mounting flange 1602b which is mounted to Z forcer support 1601. It should be noted that for each of the respective motions of the three axes, only the coils 1704 and 1801 are required to move, while the majority of the mass of the forcer in the form of magnets and core, remain stationary.

Embodiments of a system in accordance with the above description can provide XY motion of a probe tip holder and so a probe tip, without requiring the body of either of the forcers 1701 to move move. This should be noted as a consequence of the pivoting drive arm arrangement, and is in contrast to other XY motion systems where typically one of the two orthogonal axes must "carry" the other axis, and hence the mass associated with it. Since neither forcer body moves, the weight required to move is reduced, allowing for faster acceleration and deceleration of the probe tip holder. This in turn provides a higher throughput since the probe tips can move between probing positions faster. Furthermore, while it should be noted that other forcer types than that described can be used in the system, the voice-coil type is particularly well suited to the system, since it provides for a very low moving mass, and high force-to-weight ratio. These considerations provide for a motion means with a significantly higher acceleration-to-mass ratio than other multi-axis systems.

In an embodiment, the system is configured such that the near orthogonal X and Y motions move approximately the same mass. The symmetry of the moving mass provides symmetrical moving speeds and accelerations consistent with the advantageous rotational symmetry in the case of multiple probe modules 1002. It should further be noted that many work pieces that are required to be probed or tested show a random and homogeneous distribution of pads and circuit elements, and thus uniformity in motion among axis directions is typically desired to maximize throughput and simplify control.

When moving the probe tip holder in the XY plane, the Z axis typically requires two moves, first away from the work piece to clear the surface prior to XY motion, and then down to make contact with the work piece, in order to move a probe 1101 from one probe pad to another on the work piece. By locating the Z forcer and bearings close to the probe holder 1305, the embodiment provides a very light moving Z mass and stiff support of the probe to allow for high accelerations and hence high throughput. The constant-force characteristic of the voice coil also lends itself to the probing application with its inherent ability to provide control of the force on the probe tip in the Z direction when the probe 1101 is in contact with the work piece surface.

Probe Tip Configuration

As describe above, a probe tip holder holds a probe tip adjacent the surface of the work piece. The probe tip holder allows the use of any required probe tip type, shape, or material, to be used to measure the characteristics of the electrical elements of the work piece, such as the resistive or capacitive properties of the device in question depending on the application requirements.

FIG. 22*a* shows an embodiment of a single probe tip 2201 in a mount 2202. The probe tip mount provides rigid mechanical support of the tip and may provide electrical connection of the probe tip to the measurement circuit 808 through at least one conductor 2203.

FIG. 22*b* shows a single probe tip 2201*b* in an impedance-matched holder 2205 in mount 2202*b* with appropriate electrical connection 2203*b* via coaxial cable 2204 or similar suitable strip line. This configuration is suitable for high speed electrical probe signals and where the measurement system connected to the probe tip 2201*b* uses high frequency signals such as for RF circuit testing or AC capacitance measurement.

FIG. 22*c* shows an embodiment of a two-probe (Kelvin type) probe tip 2201*c* in an appropriate mount 2202*c*. Kelvin probing is typically required for low resistance measurement and high accuracy measurement where the measurement system 808 uses the second probe to compensate for the resistance between the probe tip and probe pad on the work piece.

Figure 23:
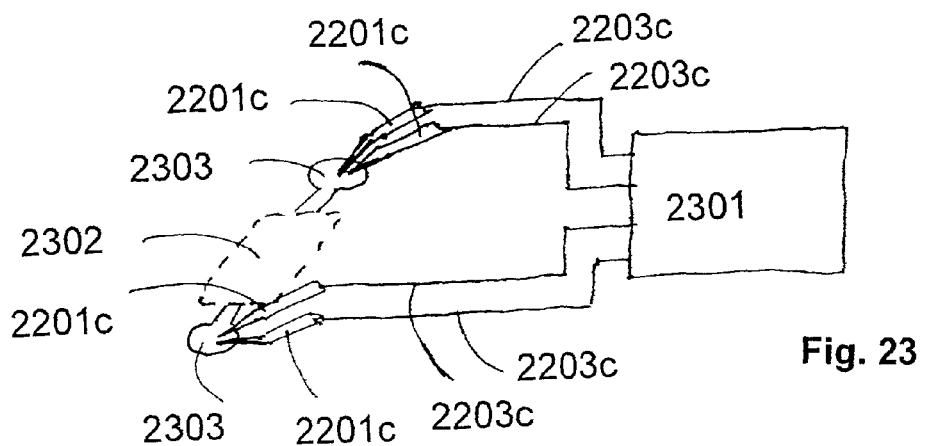
FIG. 23 depicts exemplary connections between Kelvin probe tips in accordance with the present disclosure.

FIG. 23 depicts the connections 2203*c* between two Kelvin probe tips 2201*c* of a typical 4-wire measurement system 2301. Measurement system 2301 may be part of the probe controller 808. The Kelvin probe tips 2201*c* contact the probe pads 2303 on each side of the device under test 2302.

Figure 24:
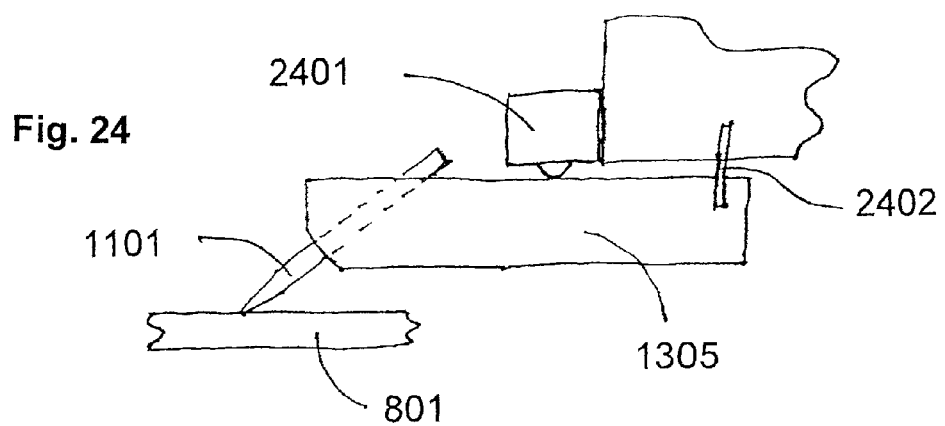
FIG. 24 depicts an exemplary probe tip holder in accordance with the present disclosure.

The probe tip holder 1305 may be fitted with a force sensor 2401 as shown in FIG. 24. The force sensor 2401 is configured to measure the force being applied to the probe 1101 at any time, by measuring the force exerted on, or deflection of, the probe holder 1305. The probe holder 1305 may be connected to the probe module mechanics through a flexure 2402 or other means, to allow adequate representation of the force exerted on the probe tip to be detected by the sensor 2401. The information from the force sensor 2401 is used to facilitate appropriate tip pressure on the pad to ensure good electrical contact and also to punch-through any potential insulating layer if present. The force sensor signal may be fed back to the probe controller 808 to allow closed loop servo operation of the Z axis to maintain a desired and consistent probe tip pressure.

Figure 25:
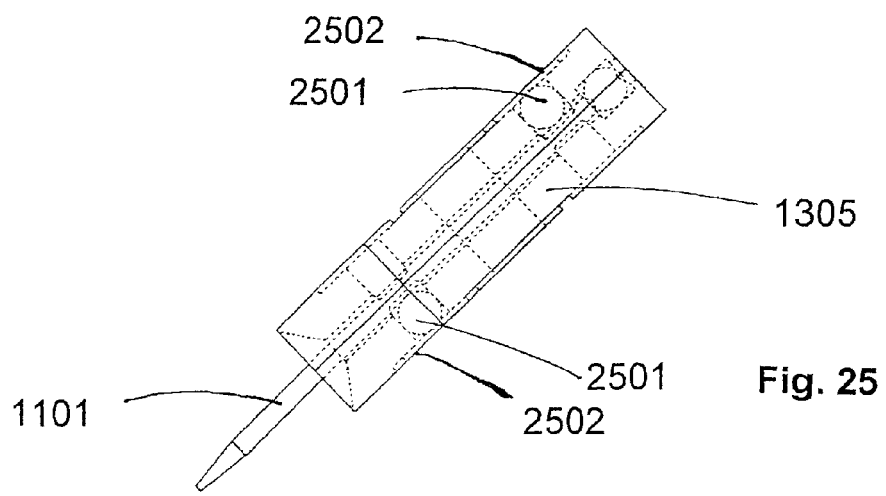
FIG. 25 depicts detail of an exemplary probe tip holder in accordance with the present disclosure.

FIG. 25 shows a mechanical drawing of an embodiment of a single probe holder 1305 which is compatible with removal and insertion of a probe 1101 without the need for disassembly or reassembly of other parts of the probe module. The probe 1101 is held in place through friction on contacts 2501 provided through springs 2502. The spring force provided by each spring on each contact also provides good electrical contact with the probe 1101 at all times, and maintains a constant probe tip position. This embodiment yields an advantageous probe holding means that allows for fast probe change while minimising the cost of the replacement part to the probe tip itself.

Probe Tip Handler

During the operation of the machine, it may be desirable to replace one or more of probes 1101 in the probe holder 1305 mounted to the probe module 1002. There are several possible reasons for the need to replace the probe tips. For example, typical probe tips which are constructed from materials such as tungsten and its alloys, molybdenum, beryllium-copper, and other metals have a limited life span usually measured in the number of "hits" or probe tip touch-downs. After a certain number of hits, the probe tip changes its contact characteristics through wear processes. The changes resulting from the probe tip wear include changes to the shape of the tip-pad geometry, changes to tip morphology at the contact point(s), modification of chemical and other material properties through repeated use. These changes typically alter the probing characteristics of the probe tip to affect the electrical and mechanical interface to the probe pads on the work piece. In electrical terms, the undesirable result of these changes may be a gradual or steep increase in the contact resistance, contact noise, pad-to-pad variability, and/or reduction of contact reliability. In mechanical terms, the undesirable result of these changes may be a gradual or steep increase in the pad damage resulting from tip abrasion, or increased stresses caused by tip penetration and shear forces acting on the pad.

A further possible reason for tip changes within a probing machine results from the advantageous selection of different probe tips based on the work piece being probed. Tip types are typically chosen based on probe pad parameters including pad size, pad coating and underlying base materials, and allowable pad damage thresholds. The probing machine thus advantageously would support the changing of probe tip types based on the circuit requirements. For example, a probe tip of 0.25 mm diameter may be optimal for penetrating an organic film over copper pads on a circuit work piece with probe pads of 0.5 mm dimensions, while a probe tip of 0.125 mm diameter may be optimal for low damage contact with gold coated pads of 0.1 mm dimensions. The circuit parameters and hence optimized probe tips may vary between circuit designs as well as within a single circuit design, so that the need for probe tip changes may be as frequent as within the processing time of a single circuit work piece, or between batches of work pieces. As a further aid to machine automation and optimisation, the system controller 805 may be configured to automatically select the optimum probe tip type from a list of available probe tips using a look-up table and making the selection based on circuit pad parameters entered as part of the program or job file.

Yet a further reason for tip changes within a probing machine results from the advantageous selection of different probe tips based on the characteristics of the device being probed. For example, it is well known to those versed in the art to use Kelvin type probes for measuring device resistances below approximately 100 Ohms. The Kelvin probes are typically dual-tip probes where contact resistance information is measured by the measurement system 808 and this information is used to correct for the contact resistance so that the true device characteristics may be obtained with the probing-related effects removed. However, the Kelvin probe tips also typically require a larger probe pad size as a result of the twin tip design compared to single-tip non-Kelvin probes. Thus it may be desirable to enable the change between Kelvin and non-Kelvin type probe tips within the probing system.

It will be understood by those skilled in the art that the preceding reasons for probe tip changes within a probing system are just some of the several motivations for providing a means for probe tip change and replacement. Embodiments of the present disclosure provide for the selection and exchange of probe tips while probing a work piece, which is not possible with previous fixture or card based probing systems. The selection and exchange to probe tips may advantageously be performed automatically by the system.

In one embodiment, the tip replacement procedure is performed automatically by the machine. An operator of the machine may initiate the probe tip exchange procedure through the user interface 805, or alternately it may be automatically performed based on criteria including but not limited to the tested tip quality, time interval elapsed since the last tip change, and number of "hits" or probe tip touch-downs selected between tip changes.

Figure 26A:
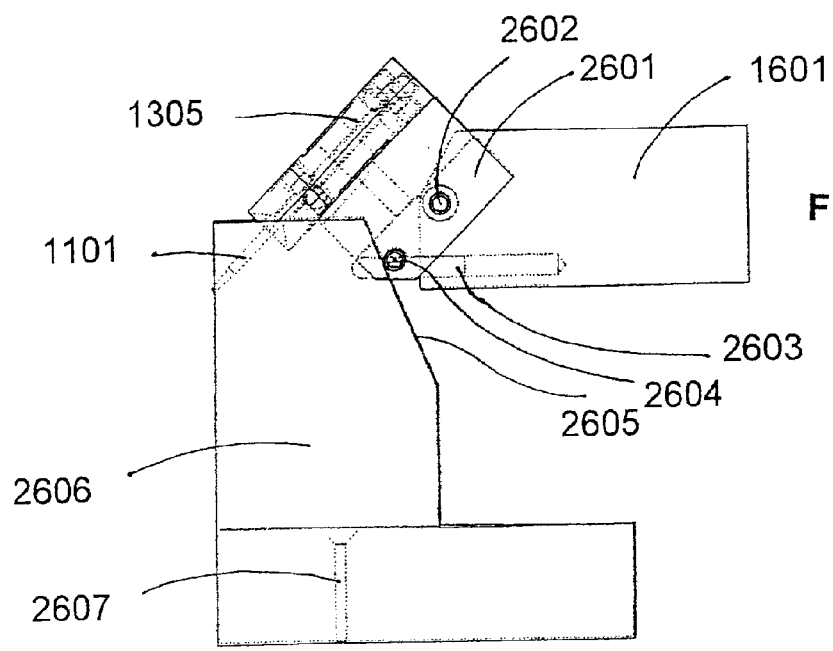
FIGS. 26a-26b depict an exemplary mechanism for probe exchange in accordance with the present disclosure.
Figure 26B:
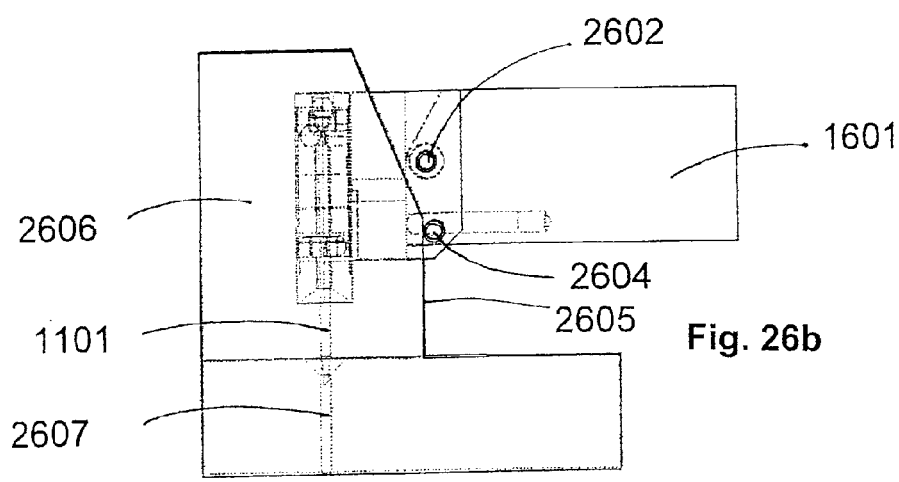

FIG. 26*a* shows an example of a mechanism for automated probe exchange. The probe holder 1305 as depicted in FIG. 25 containing probe 1101 is mounted to the Z forcer support 1601 through a pivot 2602 that is maintained at the desired probing angle by spring 2603. A probe change fixture 2606 is mounted within the machine and is typically mounted within or on the work piece fixture 802 adjacent the location of the work piece to allow positioning of the change fixture within the probe field and directly under the probe holder 1305. The positioning of the change fixture under the probe field may be accomplished using the motion subsystem as described above FIG. 26*b* shows the insertion or removal of the probe 1101 into a probe holder 2607 that is part of the probe change fixture 2606. The rotation of the probe 1101 and probe holder 1305 to vertical is effected by pin 2604 bearing upon surface 2605 and through compression of spring 2603, resulting from a downward driving force from the Z forcer 1406 through the Z forcer support 1601.

Figure 27:
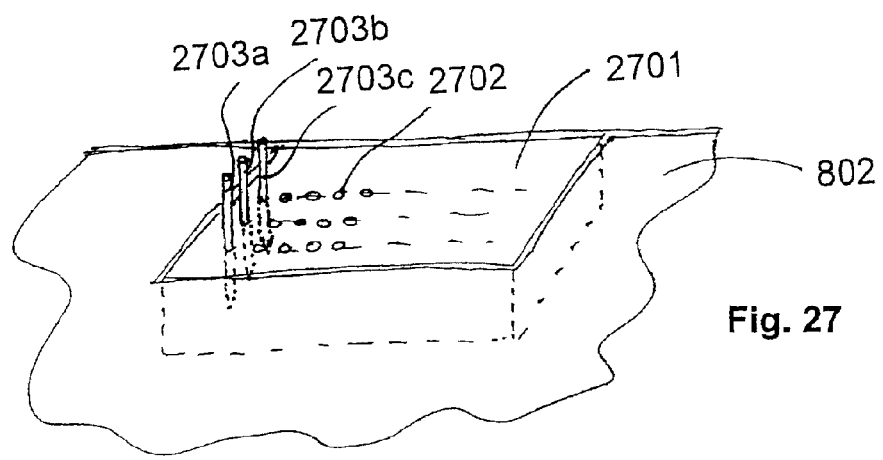
FIG. 27 depicts an exemplary probe storage magazine in accordance with the present disclosure.

Multiple probe tips 1101 may be stored and automatically changed as required in the machine. FIG. 27 shows an example of a probe storage magazine 2701 located within the machine and optionally within the work piece fixture 802. The probe magazine 2701 contains one or more probe sites 2702 which could hold probes 2703. The probes 2703*a*, 2703*b*, and 2703*c* in the figure may be identical or different in type, shape, and material according to the application requirements outlined above.

It will be understood to those familiar with the art that the preceding system and method for probe tip change can be applied to any type of probe tip clamp means and is not limited to the single probe tip or mechanics of probe removal and insertion illustrated in the figures. As another example, the work piece fixture 802 could include a robotic gripper that could similarly remove and insert probes 1101 in an automated fashion controlled by the system controller 805 and/or probe subsystem controller 808.

Furthermore, although the above probe tip holder and probe tip changing system have been described with reference to the probe and testing system using the pivotally connected orthogonal forcer means, it is understood that this type of movement is not required for the probe tip holder or probe tip change. Any type of probe movement that can position the probe tip holder over the change fixture may be used with the probe tip change system.

Probe System Control

The probes 1101 require movement in the X, Y and Z axes in order to access the required probe pads within the probe field 1001. Additionally, typically at least two probes are positioned in contact with the work piece to allow device measurement.

Figure 28:
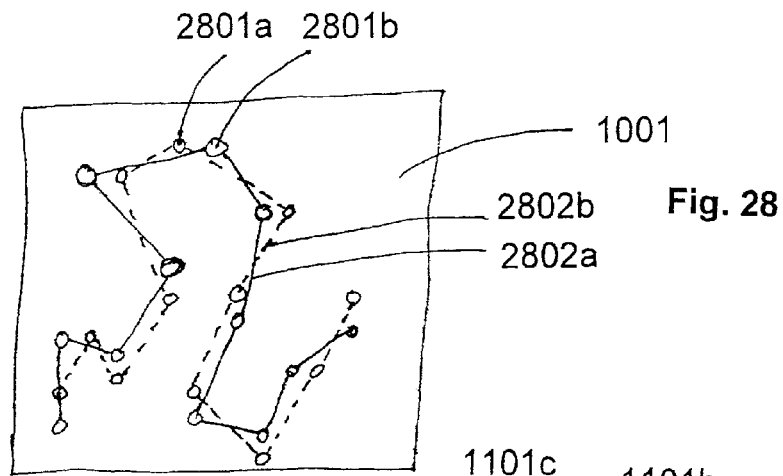
FIGS. 28-30 depict exemplary movement of probe tips in accordance with the present disclosure.

FIG. 28 illustrates a probe field 1001 containing multiple probe pads 2801. FIG. 28 shows two probes 1101 being moved from one pair of probe pads to the next, along a path 2802 until processing of the field is complete. The path 2802*a* and path 2802*b* for the respective probes, as well as the assignment of which probe is to be associated with each pad location of the work piece, are be determined so as to satisfy the following requirements.

In the case of a laser trimming system, optical access to the component being processed (for example probed and trimmed) by the laser subsystem must be provided. Appropriate probes must be chosen for each probe pad as per the discussion of FIG. 13 so that the device is not covered by a probe or its supporting mechanics.

An additional requirement may include a requirement that no part of any of the probes (support mechanics or tips) may come into contact, attempt to cross over or in any way impede the motion of other probe support mechanisms or probe tips.

Figure 29:
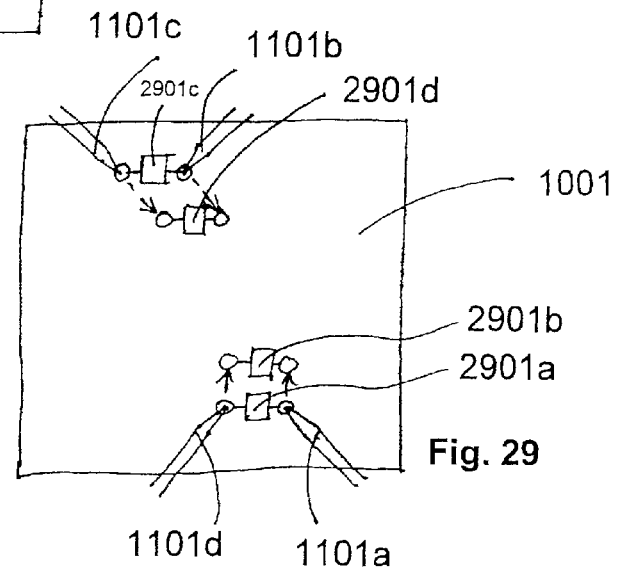

FIG. 29 depicts a simple case where a first condition exists where probes 1101*a* and 1101*d* are measuring device 2901*a*, while probes 1101*b* and 1101*c* are measuring device 2901*c*. The transition to a next state is shown by the dashed arrows where the probes are now measuring devices 2901*b* and 2901*d*. In this simple case, no probes are obscuring the devices under test, and since there is no risk of probe collision, all four probes 1101 may be moved simultaneously in straight lines from their first probe pad locations to the next pad locations.

Figure 30:
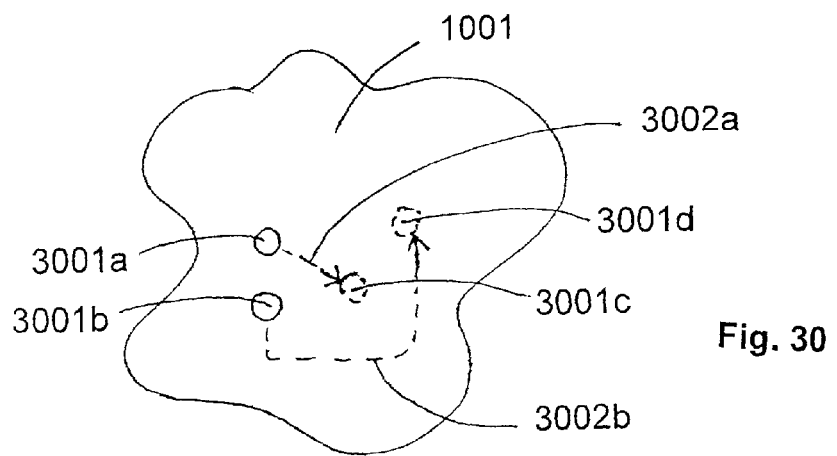

The scenario shown in FIG. 30 illustrates a more complex problem that must be handled by the probe controller 808. In this example, the probe in contact with pad 3001*a* is required to move to pad 3001*c* while the probe in contact with pad 3001*b* is required to move to pad 3001*d*. The controller 808 must provide a trajectory that avoids collision of the two probes that would otherwise result if they moved simultaneously in straight lines. The controller 808 accomplishes this by determining appropriate paths 3002*a* and 3002*b* to allow for safe motion. It should be noted that other solutions to this problem may be found, such as by delaying the movement of one probe while the other clears a safe zone. In any event, the motion control of the probes must be planned by the controllers 808 and/or 805 and may be pre-determined through calculation or through real time anti-collision control.

An additional requirement may include a requirement that the total time taken for all moves of all probes within the field should be minimized to maximize throughput. An optimum path for the paths 2801 in FIG. 28 is calculated by the controllers 808 and/or 805 to minimize the total path length and hence move time overhead. The technique for path optimisation may be that of "closest neighbors", or other standard techniques known to those skilled in the art.

An embodiment of the present disclosure utilizes four probes in a square pattern, one at each corner of the probing field allowing access to any part of the field and any pad by any probe. All probes are moved independently allowing two probes to move into position to measure the next device while two probes are measuring a current device performance during trimming without blocking access to the part by the laser trimming subsystem.

Figure 14:
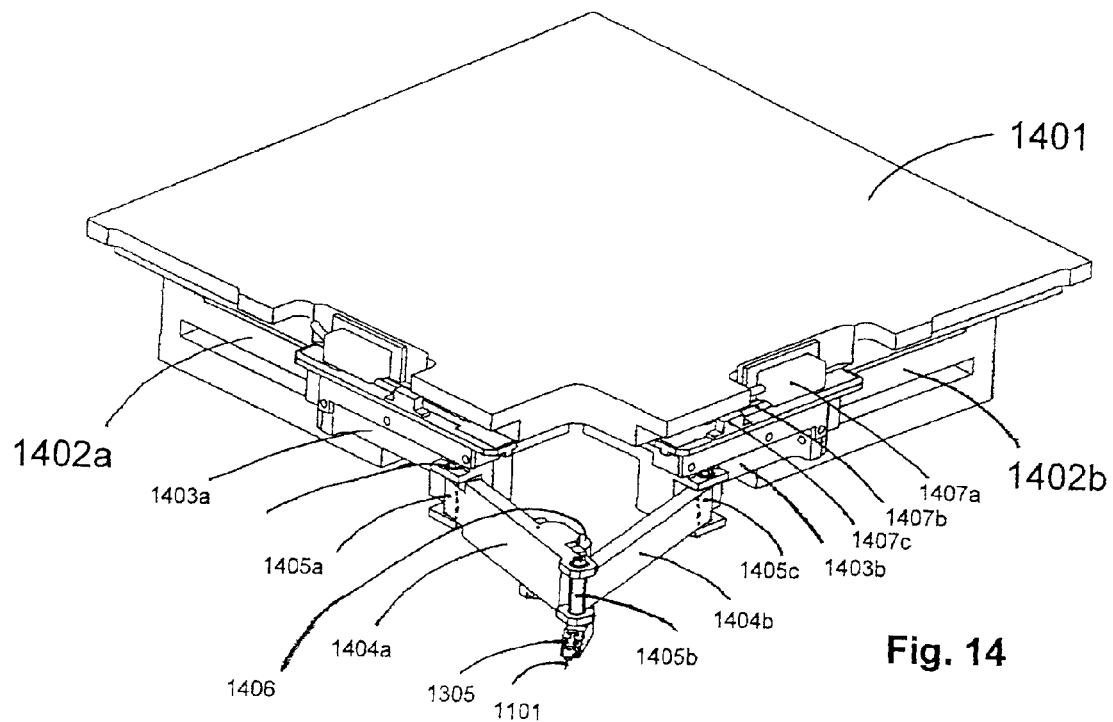
FIG. 14 depicts an exemplary probe module of a probe subsystem in accordance with the present disclosure.

The probe position may be determined through position feedback sensors, for example the position encoders, mounted in the probe actuators, for example the forcing and guiding means, as shown in FIGS. 14 through 16. These feedback sensors allow both the position and velocity of the probe to be optimized to minimize move times without stimulating mechanical resonances. Digital signal processing techniques may be used within the probe controller 808 to optimize the probe trajectories for both speed and positioning accuracy.

Figure 31:
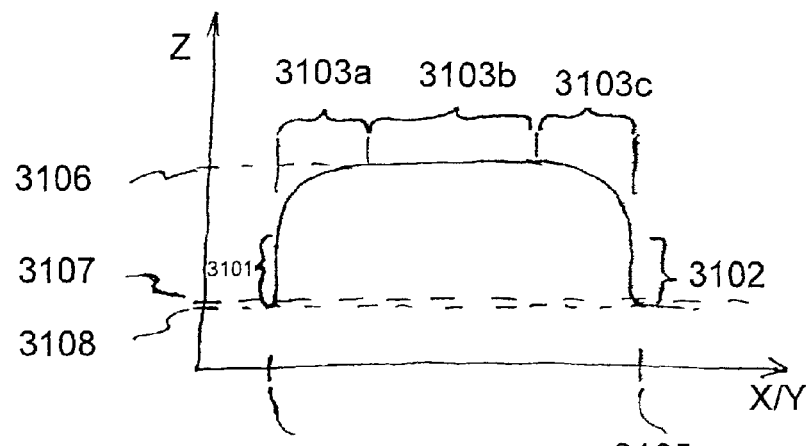
FIGS. 31 and 32 depict exemplary accelerations of a probe tip in accordance with the present disclosure.

The probe tip should be in firm contact with the device pads while the device is being processed to facilitate real time measurement. The probe tips should be moved from pad to pad as shown in FIGS. 28 through 30. A typical move profile is shown in FIG. 31. Prior to the probes being moved to another pad location the probe tip should be raised in the Z axes to a position 3106. Once the XY position is reached at 3105, the probe may be lowered into contact with the work piece as shown in phase 3102.

In an exemplary embodiment the Z axis acceleration is maximized without inducing mechanical resonances prior to X-Y motion. Once it has been determined that the tip is raised sufficiently to clear all potential objects at the work piece, at the end of phase 3101, the X and/or Y movement 3103 may begin. As the probe approaches the appropriate XY position the Z axis may be accelerated towards the work piece such that the XY velocity of the probe is zero once the probe comes close to contact during phase 3102. It is advantageous for throughput for the controller 808 to provide a contoured XYZ motion profile similar to the motion shown in FIG. 31. No settling time is required in the Z axis when driven up, so XY acceleration can begin during phase 3101a. Similarly, Z axis acceleration can begin during phase 3101c while XY is settling into position.

Figure 32:
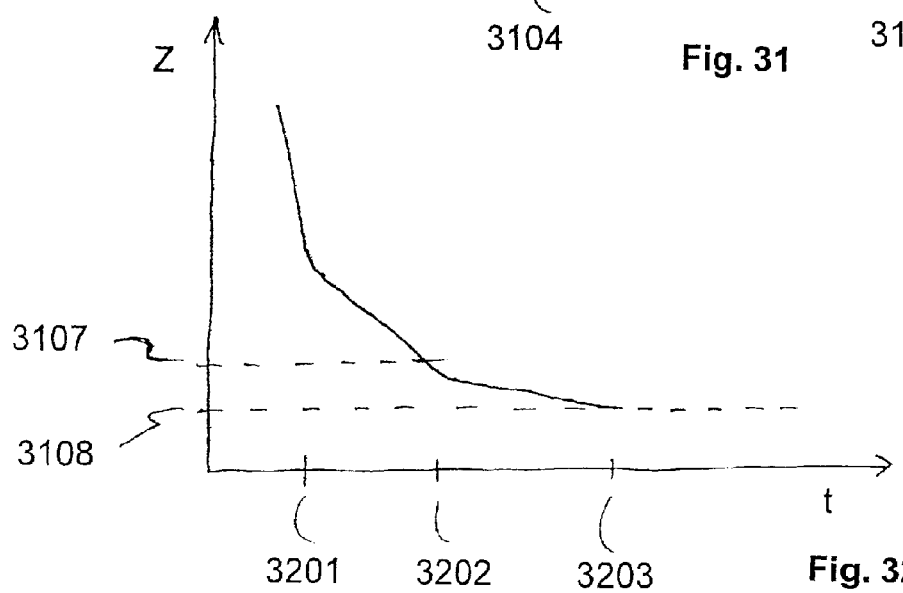

FIG. 32 shows a detail of the Z motion profile at the end of motion phase 3102. It is generally desired to decelerate the probe while reaching the contact point so as to minimise, pad damage, probe wear, and probe bounce time, as shown in the profile from time 3201 through 3203. An appropriate additional Z axes force may be used to facilitate appropriate electrical contact between the probe tip and pad. This may be depicted in the form of an over-travel in the Z axis position profile to a point 3108 which lies into the work piece beyond the position 3107 that corresponds to the probe tip contact location directly at the work piece surface.

It may further be beneficial to move the probe tip slightly in the XY plane while applying force to the pad through the Z over-travel, to allow the tip to break through any insulating layer such as an oxide layer that may have formed on the pad.

System control to obtain the above profiles may be achieved using digital servo control techniques known to those skilled in the art, via an appropriate digital signal processor that can be part of system controller 808, probe controller 805 or a combination of the two.

Calibration of Probe XY Position

The position of the probe tips in three dimensional space must be determined in order to meet the probe tip positioning accuracy requirements for correct contact with the work piece contact pads. The precise X-Y location of the probe tips must be determined in system coordinates to achieve alignment to the circuit work piece contact pads, and hence to the circuit and circuit elements being probed. This is preferably an automated operation to reduce system down time and improve system reliability.

Figure 33:
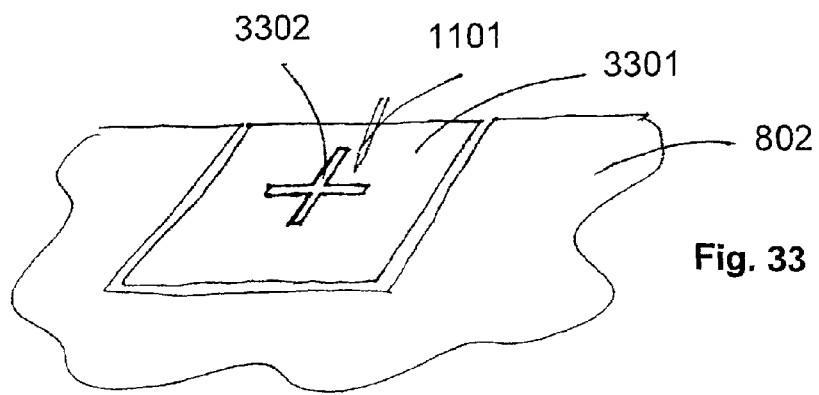
FIG. 33 depicts an exemplary calibration plate in accordance with the present disclosure.

As shown in FIG. 33, in an exemplary embodiment, probe tip calibration is achieved by incorporating a test plate 3301 as part of a calibration assembly, with at least one conductive or non-conductive feature 3302. The calibration assembly may be held in the work piece fixture in place of a work piece, or alternatively the calibration assembly may be located on the work piece fixture adjacent the work piece location, similar to the changing fixture. The calibration plate 3301 is connected to the measurement system 808. The contact test feature 3302 may be a cross or box pattern as shown in FIG. 33, or some other pattern, such as a hole. The pattern should include a 2 dimensional feature (which may extend in the Z-dimension) in order to calibrate the X-Y position of the probe tip. The position of the test plate contact feature is precisely known in system coordinates. By finding the X-Y position of the probe tip using this test plate contact feature, the probe tip X-Y position can be determined in the system coordinates.

The operation could, for example, proceed by first moving the fixture 802 using the motion subsystem 803 and controller 804 to move the calibration plate 3301 under the probe field 1001 so that the test feature 3302 is located under a nominal position at a first location within the probe field. The measurement system 808 then sets up to measure the resistance of the probe 1101 relative to the test plate 3301. The location of the probe tip is determined based on finding the edges of the feature 3302 using the contact of the probe 1101 with the test plate 3301 at a plurality of locations.

Figure 34:
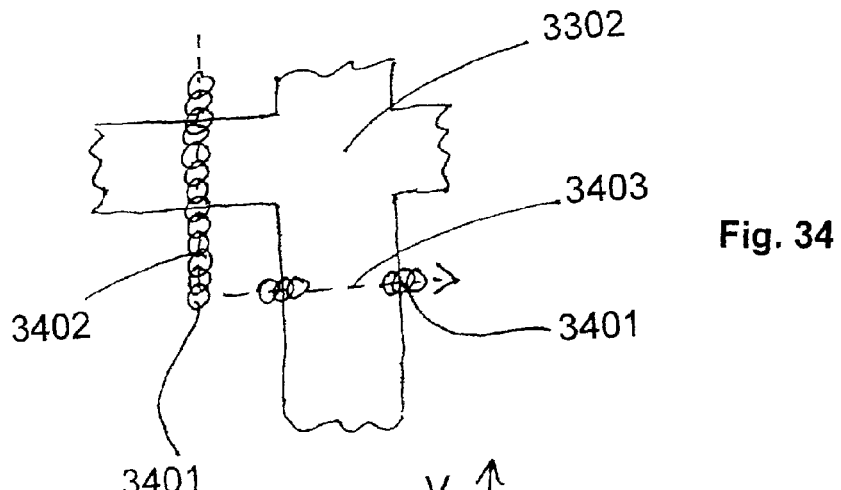
FIG. 34 depicts exemplary probe movement during calibration in accordance with the present disclosure.

FIG. 34 shows a method of finding the locations of the feature edges. In this example, the feature 3302 is non-conducting, such that when the probe is located over the feature, the resistance is high and the voltage at the probe supplied by the measurement system is high. Conversely, when the probe is in contact with the test plate outside of the feature 3302, the resistance is very low, and the voltage measured at the probe is low.

The calibration may be performed by rapidly moving the probe tip in the X or Y directions, lifting the tip between moves. A typical path 3402 for determining feature edges in a first direction is followed. With each touch-down 3401, the measurement system is read to determine contact. The distance between touch-downs 3401 is determined based on the search algorithm employed and required resolution of the calibration, as may be determined from well known techniques. Another path 3403 may be followed to determine the location of feature edges in another direction as shown.

Figure 35:
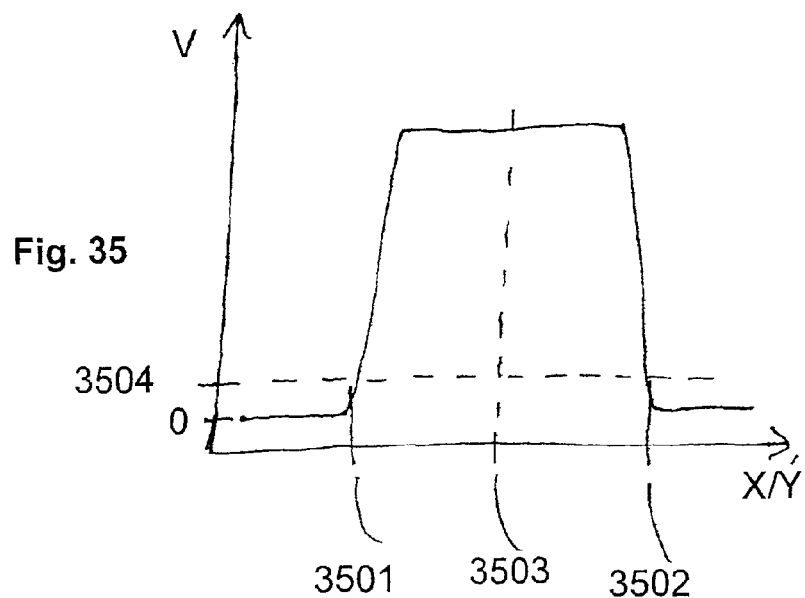
FIG. 35 depicts exemplary probe measurements during calibration in accordance with the present disclosure.

A typical plot of measurement values characteristic of an embodiment is shown in FIG. 35. The curve represents values as determined along a path 3402 or 3403. A threshold 3504 may be used to determine edges 3501 and 3502 corresponding to probe tip locations at the edges of the feature 3302. The edges may be interpolated to determine a center location 3503 for the probe tip relative to the feature.

Figure 36:
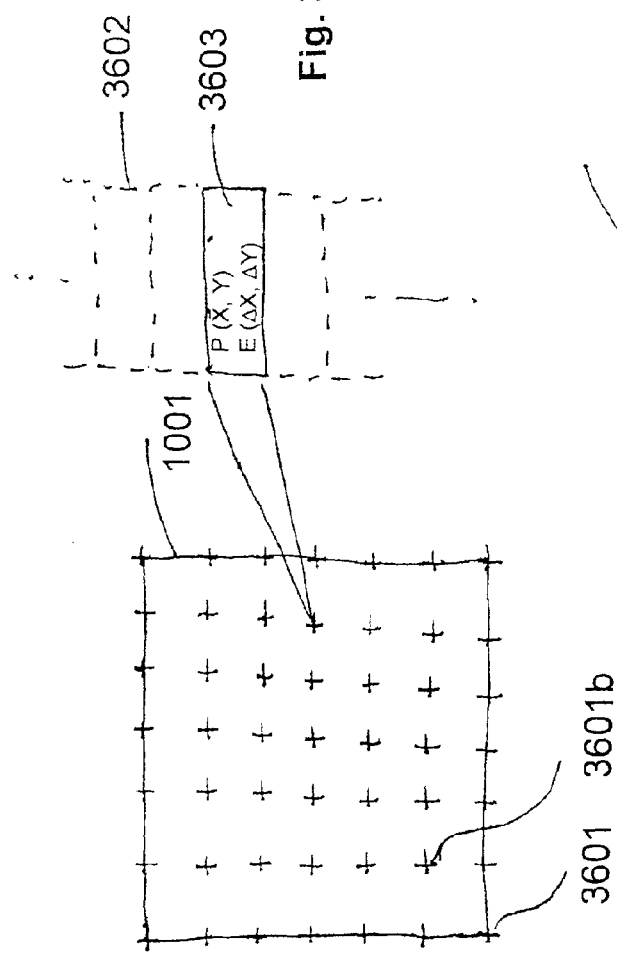
FIG. 36 depicts an exemplary calibration plate in accordance with the present disclosure.

To remove any non-linearities present in the system, the above procedure of determining probe tip position is repeated with the calibrating plate located at a plurality of locations under the probe field 1001 as shown in FIG. 36. The test plate 3301 is positioned at typically a grid of locations 3601, and the probe tip location is determined at each one. The position of the feature 3302 is known in the system coordinates through the motion subsystem controller 804, so that a table of points 3602 corresponding to the grid locations can be constructed. The table 3602 can be a look-up table in the controller 808 and/or 805, containing nominal and difference positions for the probe tip locations at each of the grid of points 3601. The controllers 808 and/or 805 may interpolate or otherwise calculate using the information contained in table 3602 to correct the commanded probe position at any position during processing.

The procedure outlined above may then be repeated for probes of other probe modules. In this manner, several look-up tables 3602 may be present in the controllers 808 and/or 805.

The above sequence may also be automatically repeated at appropriate intervals during production operation to ensure accurate probe tip positioning throughout a job and to determine/predict probe tip failure. Additionally, a grid pattern calibration plate could be used to determine more than one probe tip location in parallel and thereby reduce the time required in order to calibrate the alignment of all the probe tips.

It will also be recognized that an actual work piece circuit, rather than the special test plate 3301, may be used for alignment calibration, that is, to determine some or all probe tip locations with respect to the actual circuit pads. It should also be noted that the precise probe tip alignment technique described above could, if desired, be alternatively accomplished using a vision system connected to the system controller, or other sensing means such as an area-based position sensitive detection resistive sheet, to determine the tip location with respect to the system coordinates along the X and Y axes.

It is recognized that the probe calibration system may be used in a probing and testing system, regardless of how the probe tip moves. The above description describes the probe tips moving via pivotally coupled orthogonal forcer means, however any type of means providing movement of the probe tip in the X-Y plane.

Calibration of Probe Z Position

In order to ensure that each of the probe tips will make accurate contact with the probe pads of a circuit for measuring an electrical characteristic of a circuit element, probe tip Z calibration should be performed.

Figure 37:
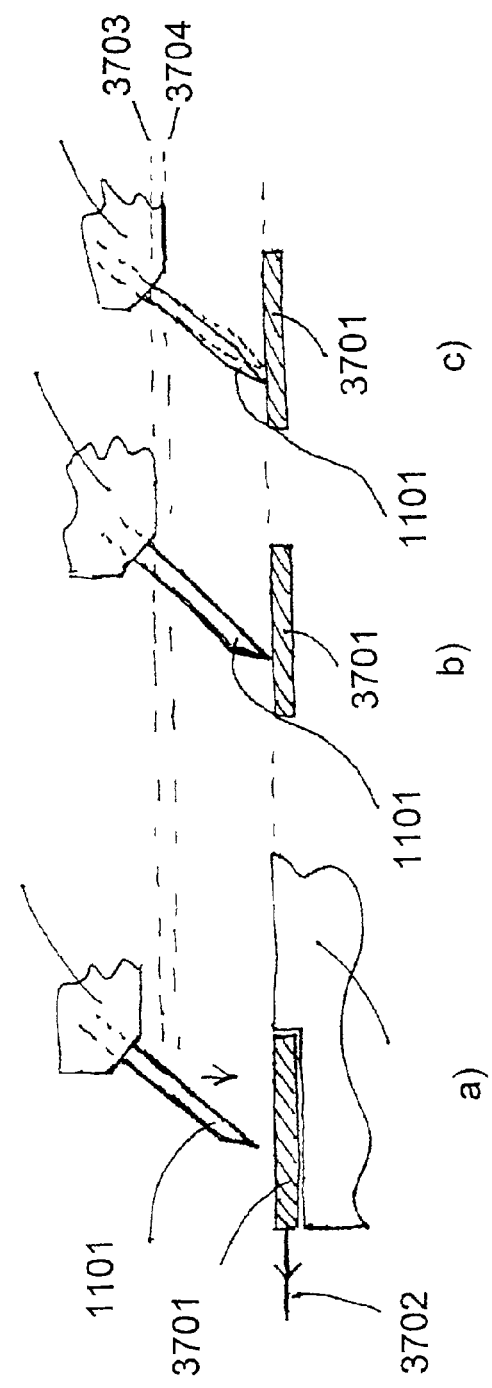
FIG. 37 depicts an exemplary process of calibrating a probe tip in accordance with the present disclosure.

Referring to FIG. 37, for accurate probing, uniform probe tip Z axis positioning relative to the circuit board, i.e., planarity, must be maintained over the probing field. It will also be recognized that probe tip over-travel after contact describe above will affect contact quality due to scrubbing as well as probe life due to contact/scrub force and bending of the probe tip.

To calibrate the probe in the Z direction, a flat conducting calibration plate 3701, which could be the calibration plate 3301 described above, preferably located at the work piece fixture surface 802, is connected to the probe measurement subsystem by connection 3702.

In one embodiment, the X and Y stages of the motion subsystem 803 move the work piece fixture, and therefore the calibration plate 3701 under the probe field. The probe measurement subsystem sets-up to measure resistance of selected probes relative to the test plate. The probe controller 808 moves the probe tip along the Z axis towards the calibration plate 3701 such that the probe tip 1101 makes contact with the calibration plate. As soon as the measurement system determines that contact has been made, the position of the Z axis 3703 is stored in memory.

FIG. 34 shows a representation of the probe tip as it contacts the test plate. Diagram a) shows that the probe tip is brought down on to the calibration plate 3701 when the probe XY and calibration plate are in position; b) shows that the tip has essentially contacted the pad of the calibration plate; and c) shows that the Z axis calibrated position is moved slightly past the point of contact 3703 to an over-travel location 3704 to cause the tip to scrape the pad slightly and facilitate a good electrical connection. This latter over-travel may programmed based on known factors such as probe types, materials and surface conditions to assure good electrical contact while at the same time preventing excessive probe tip wear, circuit damage, and probe bounce.

The procedure described above is repeated for each probe of the probe modules to determine and store in memory the calibrated probe Z positions for each probe. The controllers 808 and/or 805 interpolate or otherwise calculate using this information to correct the commanded probe Z position during processing.

Depending on the accuracy of probe Z position calibration, it may desirable to calibrate the Z probe tip position at a plurality of points within the probe field. A technique similar to that described above for XY calibration can be used to obtain a Z position table corresponding to a grid of points as shown in FIG. 36. Utilizing the saved Z position information, it is possible to construct a planarisation map of the probe tip Z positions across the probing field, and for the controller 808 and/or 805 to use this map as a lookup table to correct the probe Z positions over the probe field during processing.

Contact resistance testing after planarisation can provide verification of probe and electrical connection conditions. The point of contact, or Z contact position, can be determined after planarisation, and the appropriate final Z position of the probe tips to provide the correct over-travel for best probe contact and life can be computed using well known techniques.

It should be noted that the Z position calibration and planarisation technique described above may be accomplished with the use of a vision subsystem connected to the system controller, or other sensing means to determine the tip location with respect to the system coordinates along the Z axis. The technique described above may additionally or alternatively be used during automated system operation to test for probe tip Z planarisation and thereby reduce probing errors due to contact failure as well as predict probe tip life.

It is recognized that the probe Z calibration system may be used in a probing and testing system, regardless of how the probe tip moves. The above description describes the probe tips moving via pivotally coupled orthogonal forcer means, however any type of means providing movement of the probe tip in the XY and Z planes.

Machine Configuration and Control

Figure 19:
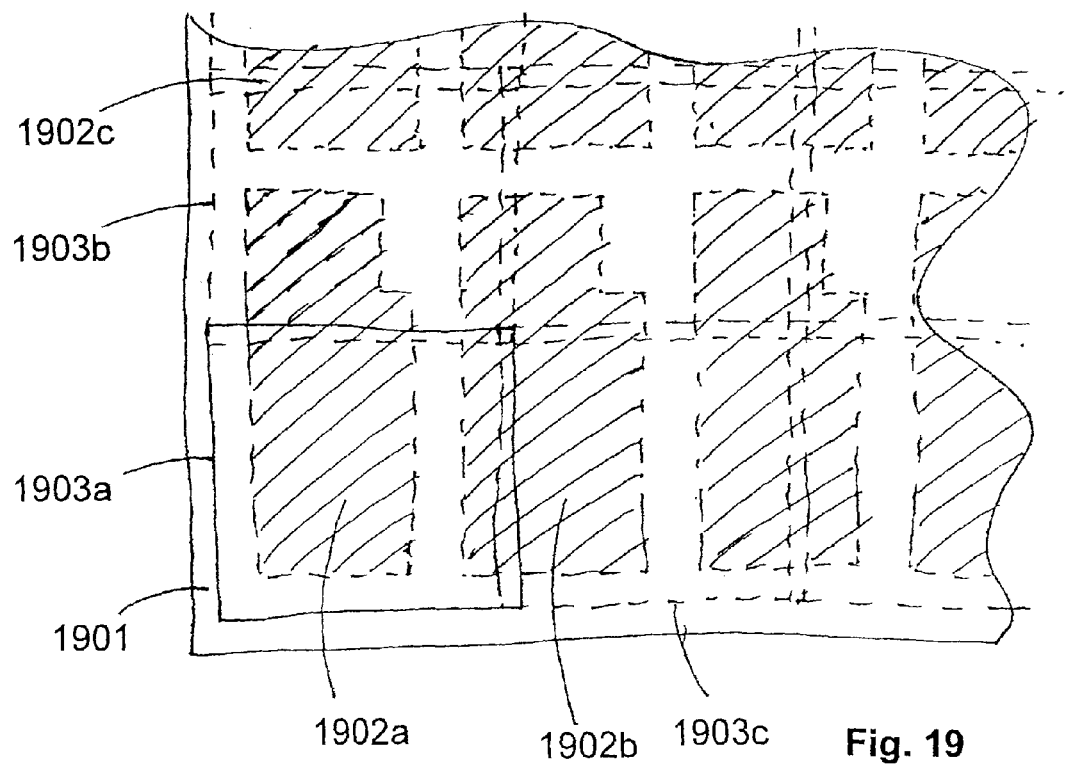
FIG. 19 depicts an exemplary work piece for alignment under a probe field in accordance with the present disclosure.

The work piece 1901 shown in FIG. 19 has multiple circuits 1902 to be probed. During operation of the system, the X-Y stages 803 are commanded by the system controller 804 and 805 to position work piece regions underneath the probe field 1001 for probing.

During the processing of the work piece, the probing regions are indexed to position the probing field over the desired work piece probing region by a sequence of XY stage of the motion subsystem 803 axis motions. This indexing may be based on a regular spacing, such as that defined by the probe field size in order to provide complete coverage of the work piece, or it may be non-regular such as based on coverage of only the circuit elements to be probed.

In any case, the positioning of the probing field may be independent of the circuit layout on the work piece. As shown in FIG. 19, probe field locations 1903 do not correspond to the circuit locations 1902, but adequately provide the required area coverage to enable probing of all required circuit elements on the work piece.

It can be seen that under the present invention the probe field size is largely independent of the circuit size, with the exception that the probe field size must be at least as large as the maximum spacing between any associated probe pads within any circuit on the work piece required for measurement, so that the pads can be simultaneously contacted for measurement. The controllers 805 and/or 808 divide the probing task into distinct areas smaller than or equal to the probe field size. The selected work piece areas are sequentially positioned under the probe field for processing, and the system processes each field according to the respective accessible elements contained therein. It should be noted that there is no limitation to the density and distribution of circuit elements and probe pads within the probe field.

The controller 805 may be further configured to allow division of the probing areas to be selected in order to minimise the work piece positioning time, and also to adjust the probing field size and positioning dependent on the circuit layout to optimize probe pad density within the probing fields for optimum speed. Additionally, the fixture 802 indexing path may be optimized for speed by minimization of the total move time. It is also possible to position the probe fields according to circuit layout if required, as in the case of CSPs, to completely access all parts of the individual circuit within the probing field.

In any case, the system controller 805 may be configured to automatically sort probe pads into distinct fields based on a number of factors, including for example the association of test points for a single circuit element or device, the probe type used, and the ability to process work pieces using multiple passes for different probe types if required.

Figure 20:
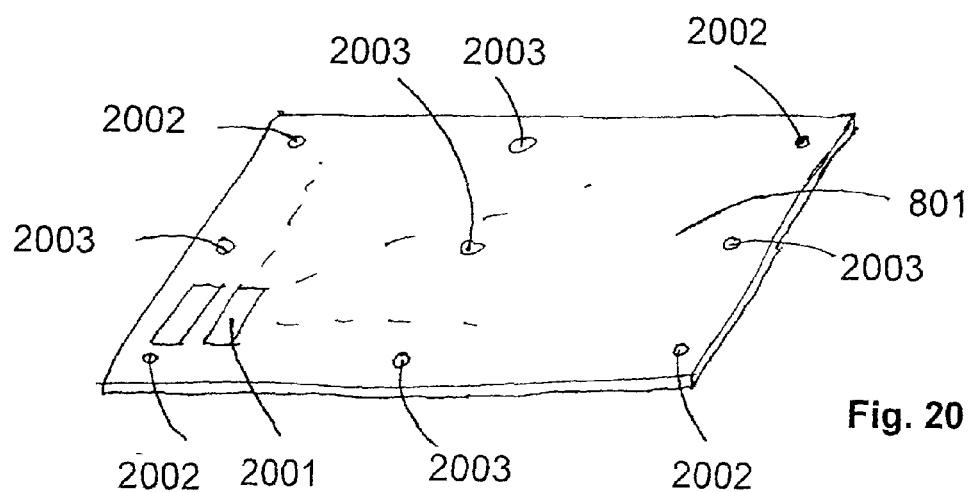
FIG. 20 depicts an exemplary work piece with alignment targets in accordance with the present disclosure.

The vision subsystem 811 described earlier is configured to provide a means for alignment of the work piece 801 on the fixture 802. This alignment may be required to position the probes, and laser beam in the case of a trimming system, to the correct locations on the work piece. FIG. 20 shows a typical work piece 801 containing one or more circuits 2001. Also present are four global alignment targets or fiducials 2002, typically located near the corners of the work piece. The system controller 805 commands the motion of the fixture 802 to position the targets within the field of view of the vision system 811 which then determines the actual location of the targets.

The system controller 805 determines a transformation matrix based on the nominal and actual work piece location within the system, and applies that transformation to all locations for probe positioning and beam trim operations. It may be required for some applications where the work piece is severely distorted in the XY plane, to use some form of local alignment to compensate for the relative positional errors during processing. Alignment targets 2003 provided on the work piece may be used for this purpose. In such a case, the system controller 805 is further configured to adjust the alignment transformation using well known techniques, based on the locally determined target locations.

The vision subsystem may also be used for other purposes, such as identifying a work piece being probed, or calibrating probe tips as described above.

During the probing process it may be desirable to remove contaminants from the probe tips and/or condition the probe tips. It is common for debris and/or vapor to be emitted from the material being probed. Additionally, the work piece probe pads themselves may have a coating or dust that is picked up by the probe tips during probing. Over time this material may form a deposit on the probe tips that compromises the electrical probe tip contact with pads on the work piece. Furthermore, the probe tip morphology may change through use, such abnormal wear and tear occurring during probe to pad contact.

To extend the useful life of the probe tips, a probe scrub pad 2101 as shown in FIG. 21 may be included in the machine, preferably as part of the work piece fixture 802. The scrub pad 2101 may be a flat plate or sheet of abrasive material, such as silicon carbide (SiC) or any other material capable of cleaning the probe tip material without damaging the probe tip 1101. The scrub pad 2101 may additionally, or alternatively, be composed of one or more cleaning materials that aid or effect the removal of debris and contaminants from the probe tips.

The system controller commands the X and Y stages to position the scrub pad 2101 under the probe field, and commands the probe controller to position the probe tip over and in contact with the scrub pad. At this point, a cycle is started which preferably involves some combination of up and down motion and X and Y axis dither of the probe tips, in order to remove debris and contaminants from the probe tip 1101. The cycle may be extended to further condition the tips in order to repair defects caused by surface morphology resulting from use. The cycle may be repeated in sequence for each of the probes 1101 in the system, or may preferentially be coordinated by the probe controller 808 and/or 805 to allow simultaneous scrubbing action of all of the probe tips to save time.

An embodiment described herein shows four probes each able to access the entire probe field. With the exception of networked resistors that require a third probe acting as a guard probe, the majority of probe tasks require two probes for measurement. This allows for simultaneous processing by two probe pairs, and can improve overall system throughput. As described above, one probe pair may be testing a circuit element while the other pair is being positioned to test the next circuit element.

Figure 38:
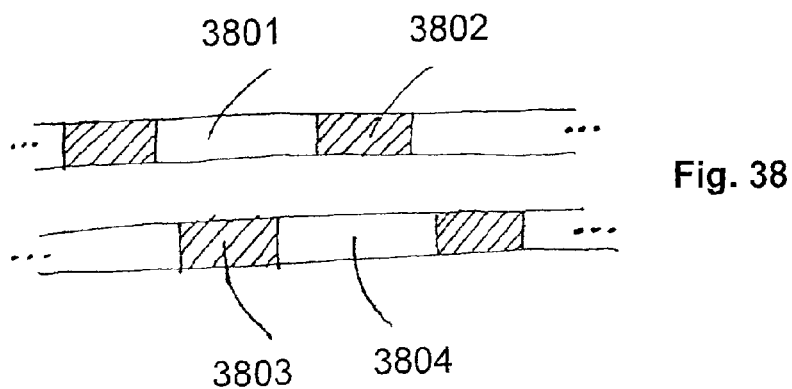
FIG. 38 depicts an exemplary time sequence of sub operations of two probe pairs in accordance with the present disclosure.

FIG. 38 shows a time sequence of sub-operations for two probe pairs. One probe pair is making measurements during period 3803 and moving to the next position during the next period 3804. The other probe pair is moving to the next position during period 3801 and making measurements during the next period 3802. In this manner, the utilization of the measurement system is increased by overlapping the probe move overhead time with processing time.

Figure 9:
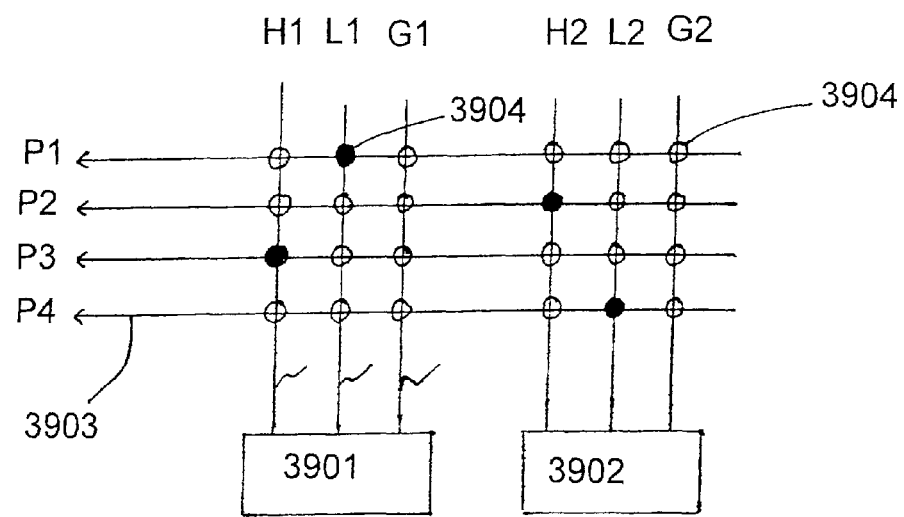
FIG. 9 depicts an exemplary probing system having two measurement systems in accordance with the present disclosure.

A further embodiment is shown in FIG. 9 where two measurement systems 3901 and 3902 can be simultaneously connected to any of the four probe signals 3903. Through the independent matrix connections 3904, it is possible to make two measurements simultaneously and use all four probes.

As described above, the system provides overhead access to circuit components under testing or probing. As described this can be used advantageously when using an overhead laser for trimming components. An overhead camera or vision system has been described for the positioning and alignment of work pieces. The vision system may also be used in identifying the components. As an example a circuit may have a discrete resistor that is to be tested. The probing system may probe the resistor to determine its characteristics. The overhead vision system may be used to identify the component based on visual characteristics, such as coloured bands of a discrete resistor. The control system may then determine if the measured characteristics from the probe match those for the component determined from the vision system. If they do not match the laser or trimming system may then be used to adjust the necessary characteristics.

The control of the testing and trimming system may be provided by a software application running on a general purpose, or high-performance purpose built computer. The control software should allow for the input of circuit details such as the location of the elements to be tested, height characteristics of the circuit elements (to avoid collisions during probe movements), identifying characteristics that may be used in the alignment of work pieces. The software can be used to determine optimized probe movement paths, provide visual information as to circuit characteristics under test and determine necessary actions for trimming of elements. The software can allow a user to set the necessary characteristics of individual elements along with the allowable tolerances for elements. If a vision system is used to identify components, the software may determine the component and its associated desired characteristics.

A system according to an embodiment of the present disclosure provides an advantage over conventional fixture-based systems which require the manufacture of custom probe cards. A system according to embodiments described herein provides the ability to probe and test circuits at reduced operating costs. A system according to an embodiment of the present disclosure and method according to the present invention has a further distinct advantage over conventional Flying probe systems and methods in providing the ability to perform electrical test of circuit elements at high throughput, as well as trimming the circuit using an overhead laser subsystem.

A system according to an embodiment of the present disclosure and method can be used advantageously in probing circuit elements of multiple differently orientated circuits disposed on a work piece surface. For example, a first circuit element may form part of a first circuit, which is disposed on a work piece surface in one orientation, and a second circuit element may form part of a second circuit, which is disposed on the work piece surface in a different orientation. In such a case, the present invention would have a distinct advantage over conventional fixture-based systems which would require that the probe card be rotated such that the probe is rotated from alignment with the first circuit after the first circuit element has been probed, and into alignment with the second circuit so that the second circuit element can be probed.

It will also be recognized by those skilled in the art that, while the invention has been described in terms of one or more exemplary embodiments, it is not limited thereto. Various features and aspects of the above described invention may be used individually or jointly.

Further, although the invention has been described in the context of its implementation in a particular environment and for particular purposes, e.g. probing of circuit elements, those skilled in the art will recognize that its usefulness is not limited thereto and that the present invention can be beneficially utilized in any number of environments and implementations. For example, while the probes described probe and test the work piece for electrical characteristics, other types of characteristics may be tested such as physical properties of the work piece. Accordingly, the claims set forth below should be construed in view of the full breadth and spirit of the invention as disclosed herein.

What is claimed is:

1. A system for probing components on a surface of a work piece, the system comprising:
    a support structure; and
    a probe subsystem coupled to said support comprising:
        a first and second arm each having a pivot point and a guide end, said first arm and said second arm pivotally coupled together at said respective pivot points;
        a probe tip holder coupled to at least one of said first arm or said second arm to locate a probe tip in close proximity to the respective pivot points; and
        guide means for guiding movement of said guide ends of the pivotally coupled arms, such that movement of said guide end of said first arm and said second arm move said probe tip holder in a plane parallel to said work piece surface.

2. The system as claimed in claim 1, wherein said guide means comprises:
    a first guide to constrain movement of said guide end of said first arm in a first direction; and
    a second guide to constrain movement of said guide end of said second arm in a second direction.

3. The system as claimed in claim 2, wherein said probe subsystem comprises a probe module having a module support frame coupled to said support structure, wherein said first arm and said, second arm are coupled to said module support frame, and wherein said first and second guides are coupled to said module support frame.

4. The system as claimed in claim 2,
    wherein said first guide end of said first arm is adapted to move in said first direction by a first forcer means providing a force generally parallel to said first direction and said first guide guides said first guide end in said first direction; and
    wherein said second guide end of said second arm is adapted to move in said second direction by a second forcer means providing a force generally parallel to said second direction and said second guide guides said second guide end in said second direction.

5. The system as claimed in claim 4, wherein said first and second forcers each comprise a voice coil type forcer providing a force generally parallel to said first and second direction respectively, each voice coil type forcer having:
    a body including a magnet arranged generally parallel to the respective direction;
    a flange slidably coupled to said body to allow movement of said flange in the respective direction; and
    a coil for producing a magnetic field perpendicular to said magnet, thereby producing said force in the respective direction.

6. The system as claimed in claim 4, wherein said first and second forcers each comprise one of:
    a linear actuator;
    a motor and gear;
    a hydraulic actuator; and
    a pneumatic actuator.

7. The system as claimed in claim 4, wherein said first and second guides each comprise:
    a forcer support pivotally connected to the respective guide end of the respective arm, said forcer support further coupled to said forcer means for moving said forcer support in the respective direction;
    a rail coupled to said module support frame arranged parallel to the respective direction; and
    a bearing mounted on said rail and coupled to said forcer support.

8. The system as claimed in claim 7, further comprising an encoding means associated with each of the first forcer and the second forcer for determining a position of the respective forcers.

9. The system as claimed in claim 1, wherein said probe tip holder holds the probe tip adjacent said surface of said work piece.

10. The system as claimed in claim 1, further comprising:
a work piece subsystem coupled to said support structure, said work piece subsystem comprising:
a work piece fixture for holding said work piece surface in a fixed position parallel to said plane, said fixed position fixed relative to said work piece fixture, wherein said work piece fixture is mounted to a motion subsystem for moving said work piece fixture parallel to said plane.

11. The system as claimed in claim 10, wherein said motion subsystem comprises one of:
a single motion subsystem comprising:
a single stage for moving said work piece fixture within said plane; or
a multi stage motion subsystem comprising:
a first stage for moving said work piece fixture along a first axis of said plane; and
a second stage for moving said work piece fixture along a second axis of said plane, said second axis generally orthogonal to said first axis.

12. The system as claimed in claim 10, wherein said motion subsystem further comprises a stage for moving said work piece fixture in a direction perpendicular to said plane.

13. The system as claimed in claim 10, wherein said motion subsystem further comprises a motion controller for controlling said stages to control a position the work piece fixture relative to said support structure.

14. The system as claimed in claim 1, wherein said probe holder is coupled to the first arm or the second arm through a probe tip forcer and a probe tip guide, said probe tip forcer for moving said probe tip held by said probe tip holder in a direction perpendicular to said plane, said probe tip guide constraining said movement to said perpendicular direction.

15. The system as claimed in claim 14, wherein probe tip guide comprises:
a probe holder support connected to said probe tip holder and coupled to said probe tip forcer for moving said probe tip holder in said perpendicular direction;
a rail coupled to the arm arranged in said direction of movement of the probe tip holder; and
a bearing mounted on said rail and coupled to said probe holder support, and wherein the probe tip forcer comprises a voice coil type forcer for providing a force generally perpendicular to the plane.

16. The system as claimed in claim 15, further comprising a probe tip position encoder for determining a position of said probe tip holder in the perpendicular direction.

17. The system as claimed in claim 16, comprising four probe modules each rotated 90 degrees relative to an adjacent probe module.

18. The system as claimed in claim 2, wherein said first direction is orthogonal to said second direction, said first and second directions parallel to said plane.

19. The system as claimed in claim 1, further comprising at least one of:
an over head laser trimmer subsystem for trimming electrical components located on said surface of said work piece;
an over head vision subsystem;
an automatic probe tip exchanger subsystem;
a probe tip calibration subsystem; or
a system controller for receiving commands and controlling the subsystems; and
wherein said probe subsystem further comprises a controller for controlling movement of the first forcer, the second forcer and the probe holder forcer.

20. A method for probing components on a surface of a work piece, the method comprising:
holding a work piece surface in a fixed position at least partially within a plane;
moving guide ends of first and second arms that are pivotally coupled to each other such that the movement of said guide ends move a probe tip parallel to said plane, the probe proximity to the pivotal connection of the first and second arms;
moving said probe tip in a direction perpendicular to said plane such that said probe tip contacts said surface of said work piece.

21. The method as claimed in claim 20, further comprising moving said work piece surface to another fixed location; and
moving guide ends of a plurality of pairs of pivotally coupled arms to position a plurality of probes within said plane.

* * * * *